United States Patent
Hiruta

(10) Patent No.: US 10,997,049 B2
(45) Date of Patent: May 4, 2021

(54) MEMORY SYSTEM

(71) Applicant: Toshiba Memory Corporation, Minato-ku (JP)

(72) Inventor: Tatsuro Hiruta, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/566,277

(22) Filed: Sep. 10, 2019

(65) Prior Publication Data
US 2020/0142799 A1    May 7, 2020

(30) Foreign Application Priority Data
Nov. 5, 2018   (JP) .............................. JP2018-208330

(51) Int. Cl.
| | |
|---|---|
| *G11C 7/04* | (2006.01) |
| *G06F 11/30* | (2006.01) |
| *G11C 11/4063* | (2006.01) |
| *G06F 12/02* | (2006.01) |
| *G06F 13/16* | (2006.01) |

(52) U.S. Cl.
CPC ...... *G06F 11/3037* (2013.01); *G06F 11/3058* (2013.01); *G06F 12/0246* (2013.01); *G06F 13/1673* (2013.01); *G11C 7/04* (2013.01); *G11C 11/4063* (2013.01)

(58) Field of Classification Search
CPC ............. G06F 11/3037; G06F 11/3058; G06F 12/0246; G06F 13/1673; G11C 7/04; G11C 11/4063
See application file for complete search history.

(56) References Cited

U.S. PATENT DOCUMENTS

| | | | |
|---|---|---|---|
| 8,289,787 B2 | 10/2012 | Kim et al. | |
| 8,472,274 B2 | 6/2013 | Fai et al. | |
| 9,734,919 B2 * | 8/2017 | Ghaly | G11C 29/50 |
| 2014/0359242 A1 * | 12/2014 | Son | G11C 11/4076 |
| | | | 711/167 |
| 2018/0335978 A1 * | 11/2018 | Tidwell | G06F 3/0625 |
| 2020/0073451 A1 * | 3/2020 | Nowell | G06F 1/3296 |

FOREIGN PATENT DOCUMENTS

| | | |
|---|---|---|
| JP | 10-21693 A | 1/1998 |
| JP | 2002-367382 A | 12/2002 |

* cited by examiner

*Primary Examiner* — Pho M Luu
(74) *Attorney, Agent, or Firm* — ObLon, McClelland, Maier & Neustadt, L.L.P.

(57) ABSTRACT

A memory system includes a memory device including first storage elements which store data, a temperature sensor which measures a temperature of the memory device, and a controller including a processor which acquires a current temperature from the temperature sensor as a first temperature, acquires a temperature when the data is written into the first storage element, from the memory device as a second temperature, determines whether a difference between the first temperature and the second temperature exceeds a predetermined temperature difference, and when the difference exceeds the predetermined temperature difference, instructs the memory device to rewrite the data written in the first storage element. The memory device includes a sequencer which determines a voltage for the rewrite, based on the difference and a voltage when the data is written into the first storage element.

17 Claims, 16 Drawing Sheets

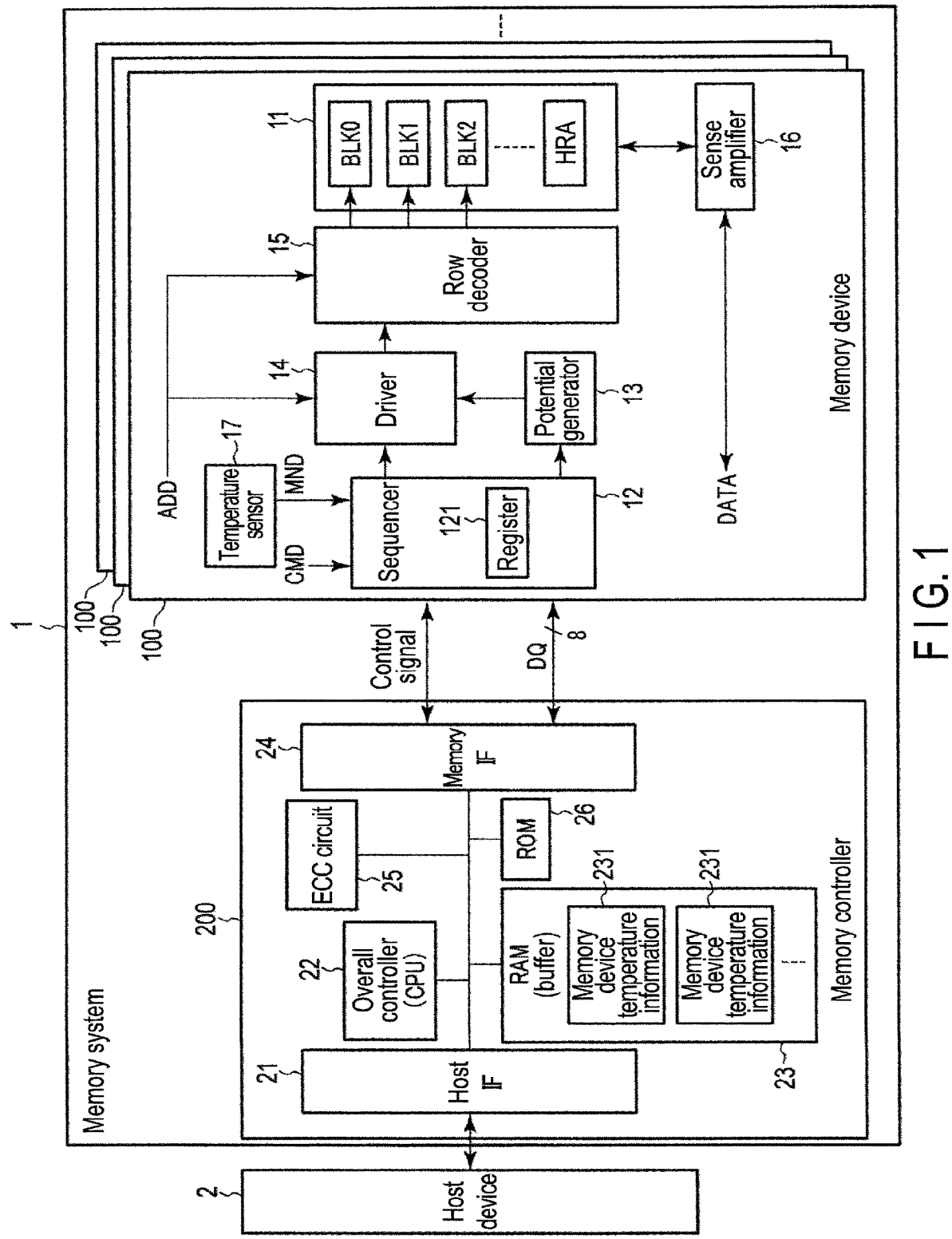
F I G. 1

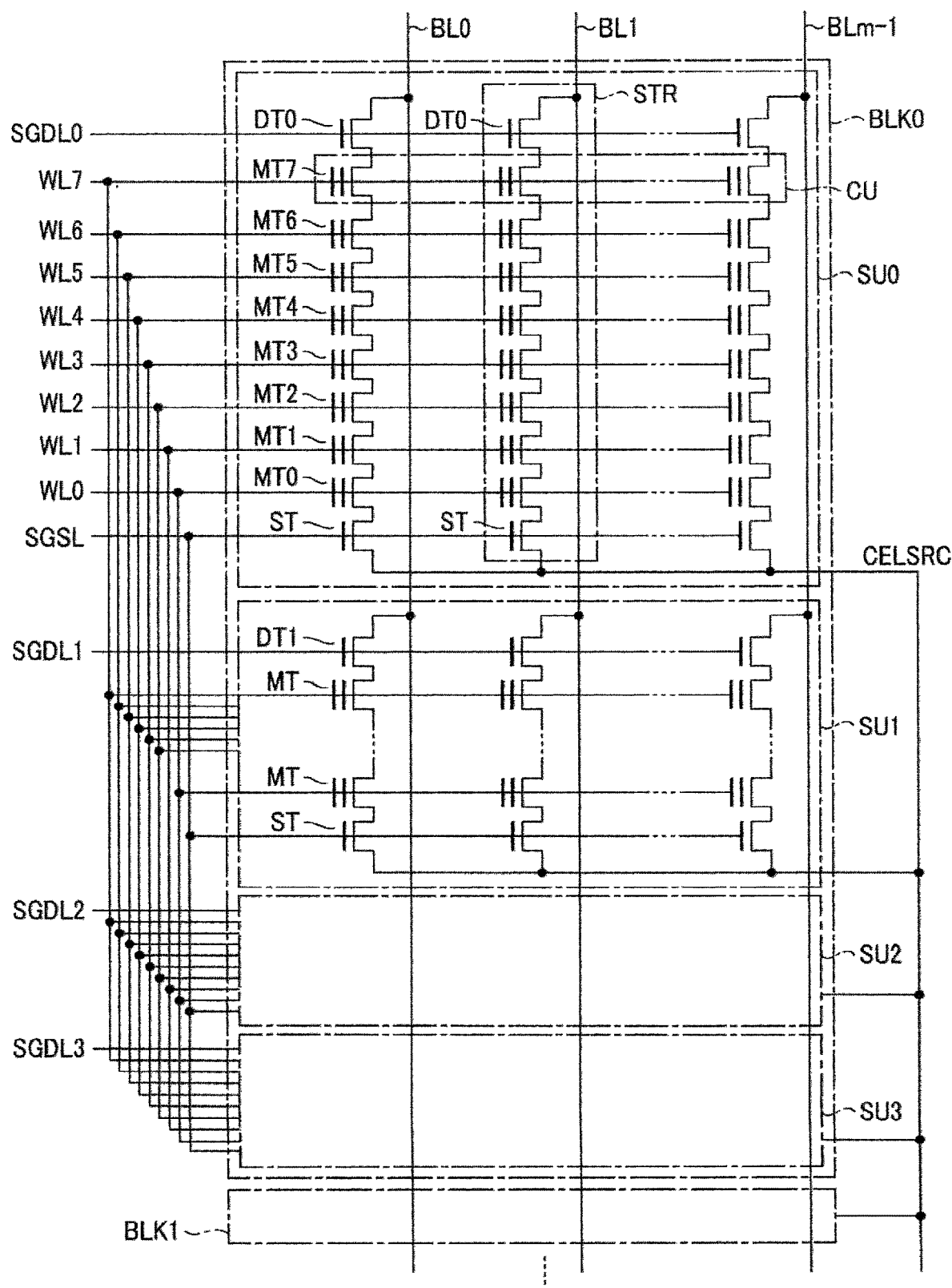
F I G. 4

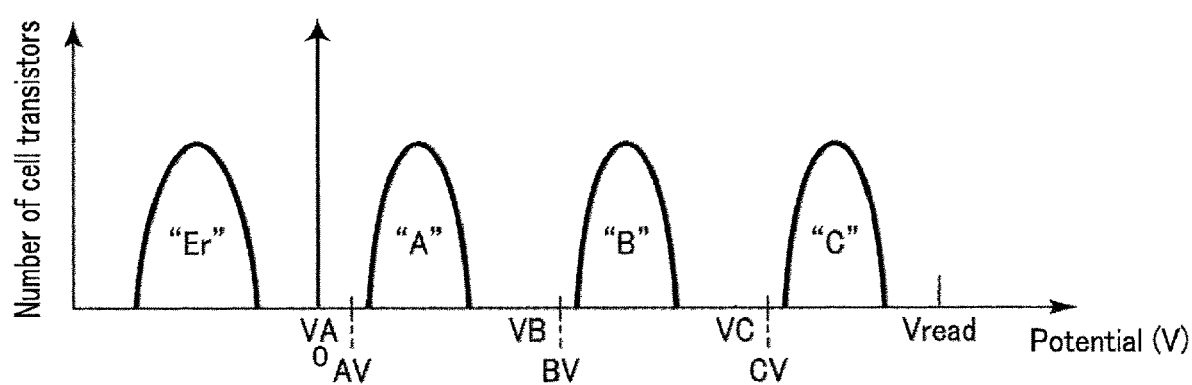
F I G. 6

| Page address | Write temperature |
|---|---|
| 1 | TW2 |
| 2 | TW2 |
| 3 | TW3 |
| 4 | TW4 |
| 5 | TW4 |
| ⋮ | ⋮ |

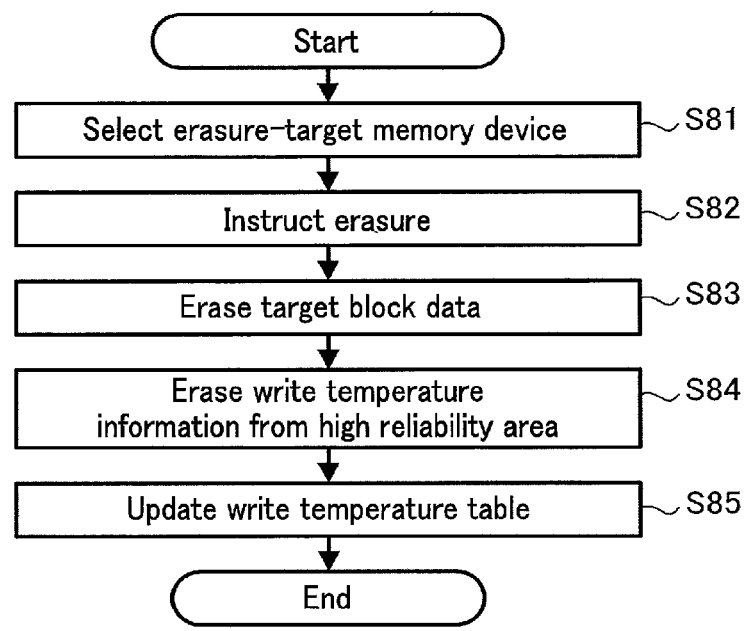
F I G. 10

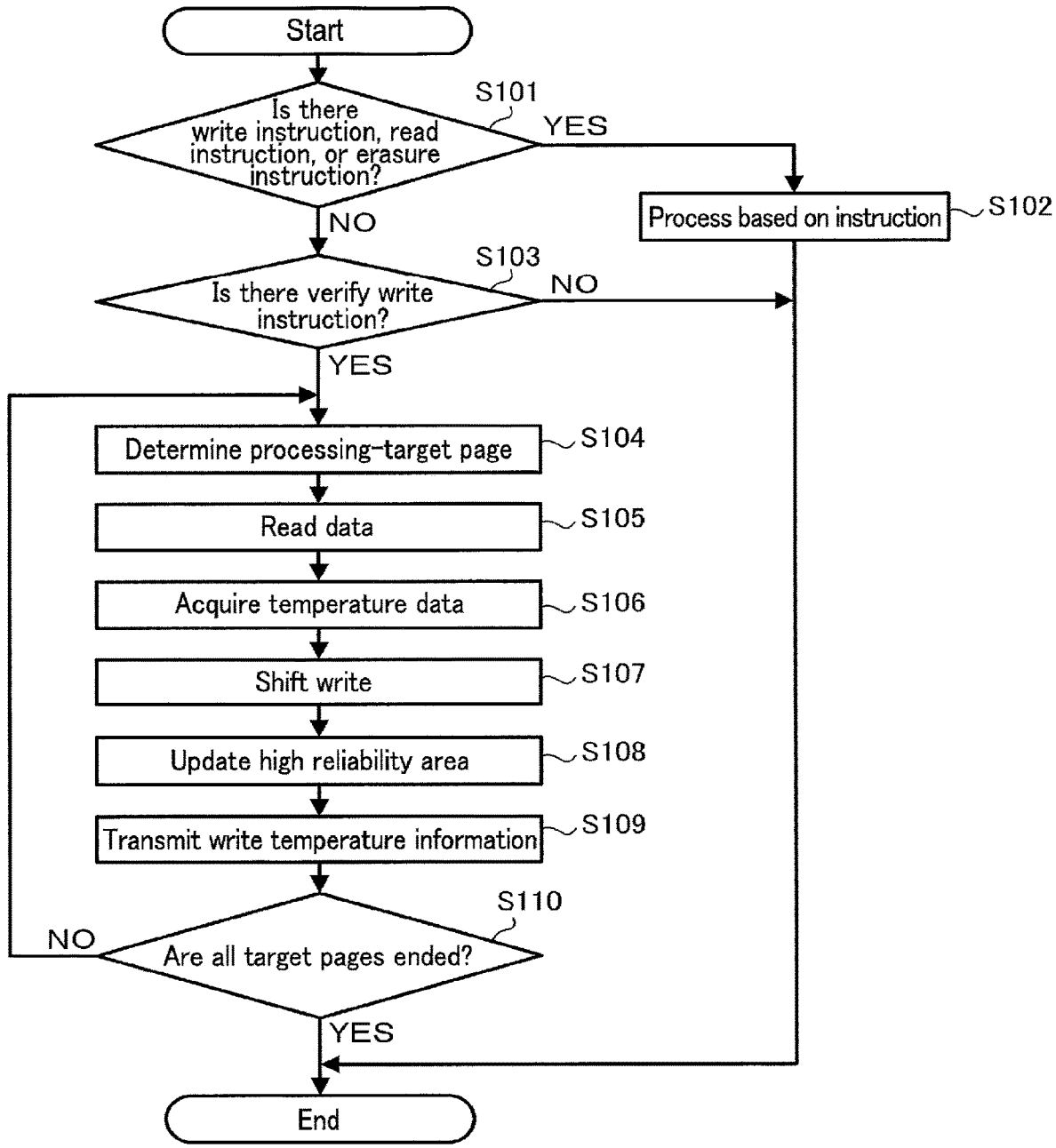
F I G. 12

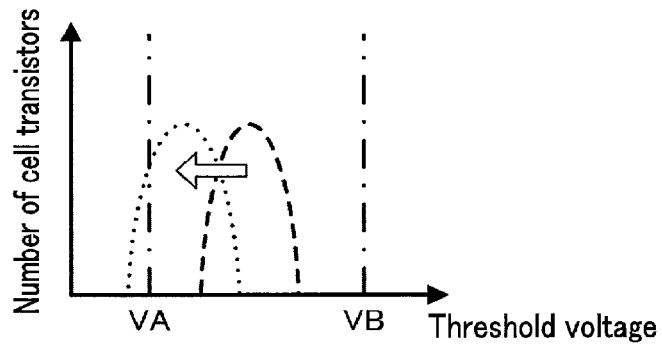
F I G. 13A
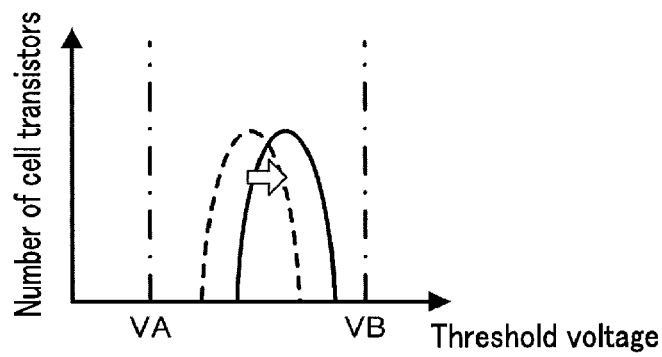
F I G. 13B
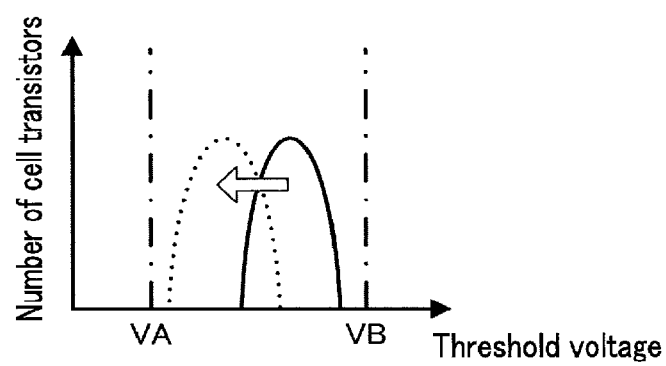
F I G. 13C

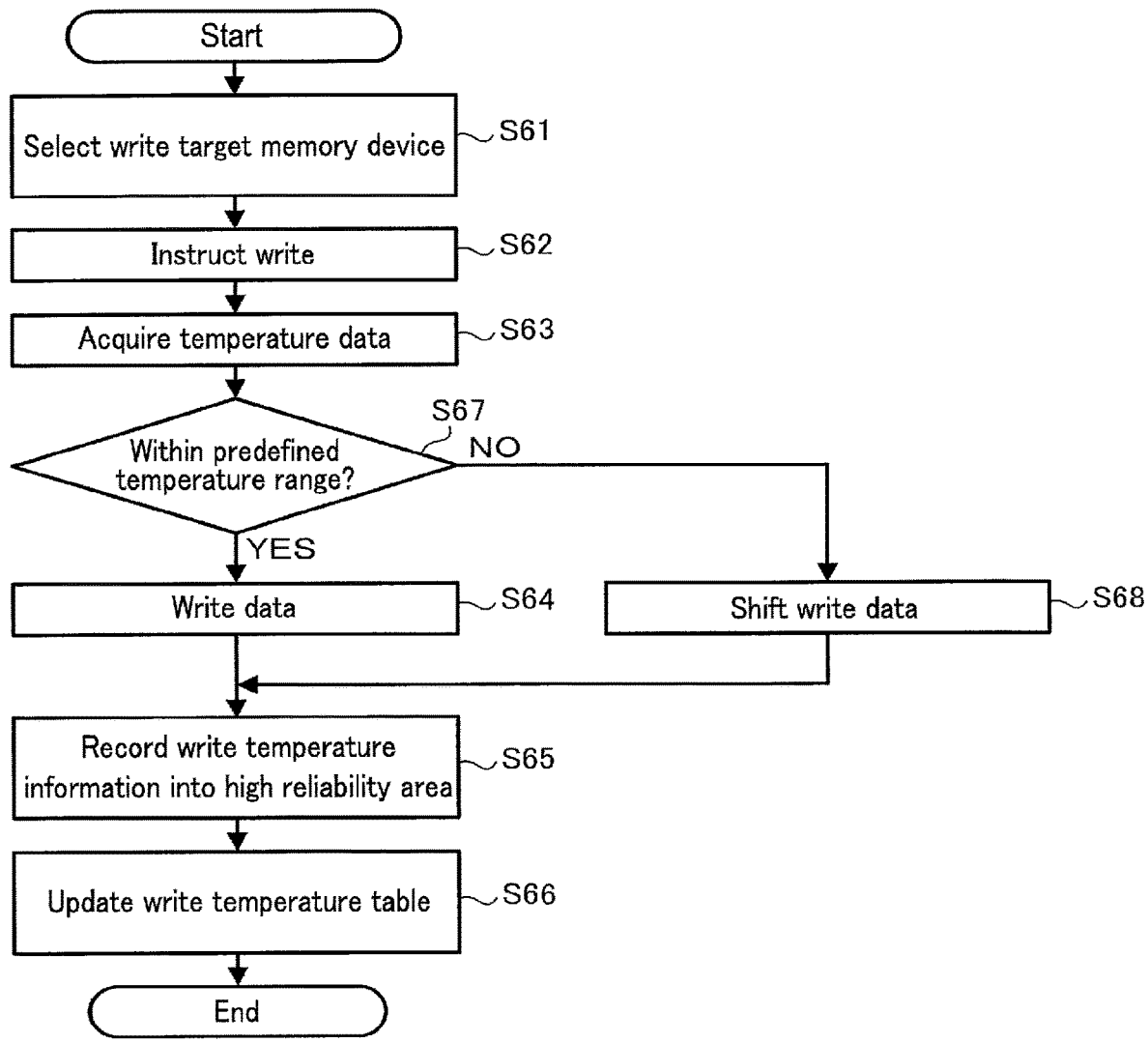
F I G. 15

| Block address | Write temperature | |
|---|---|---|
| | Minimum temperature | Maximum temperature |
| 1 | TW2 | TW5 |
| 2 | TW3 | TW6 |
| 3 | TW3 | TW7 |
| 4 | TW4 | TW7 |
| 5 | TW4 | TW8 |
| ⋮ | ⋮ | ⋮ |
F I G. 16
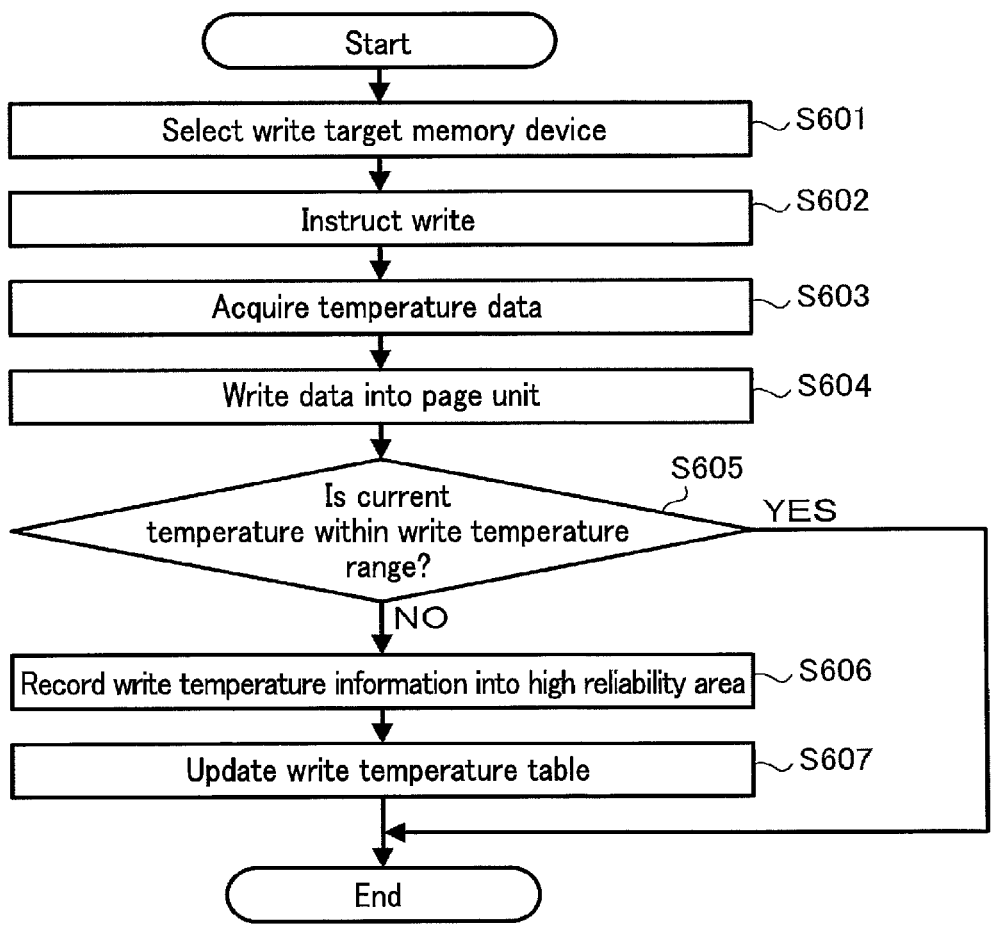
F I G. 17

MEMORY SYSTEM

CROSS-REFERENCE TO RELATED APPLICATION

This application is based upon and claims the benefit of priority from the Japanese Patent Application NO. 2018-208330, filed Nov. 5, 2018, the entire contents of which are incorporated herein by reference.

FIELD

Embodiments described herein relate generally to a memory system.

BACKGROUND

A memory system including a nonvolatile memory device and a memory controller to control such a memory device is known. For improved performance of the memory system, the memory controller needs to control the memory device better.

BRIEF DESCRIPTION OF THE DRAWING

FIG. 1 is a functional block diagram of a memory system of a first embodiment;

FIG. 4 is a circuit diagram of a block of the first embodiment;

FIG. 6 is a schematic view illustrating an example of data storage in a memory device of the first embodiment;

FIG. 10 is a flowchart illustrating details of a data erasure process of the first embodiment;

FIG. 12 is a flowchart illustrating another example of the operation of the memory device of the first embodiment;

FIG. 13A is a schematic view illustrating how a distribution of a threshold voltage of a cell transistor storing data is shifted by a temperature change with respect to a time of data write;

FIG. 13B is a schematic view illustrating a distribution of a threshold voltage of a cell transistor by shift write;

FIG. 13C is a schematic view illustrating how a distribution of a threshold voltage of a shift-written cell transistor is shifted by a temperature change with respect to a time of data write;

FIG. 15 is a flowchart illustrating details of a data write process in a second modification of the first embodiment;

FIG. 16 is a table for describing a data structure of a write temperature table in a second embodiment;

FIG. 17 is a flowchart illustrating details of a data write process in a memory system of the second embodiment.

DETAILED DESCRIPTION

Figure 2:
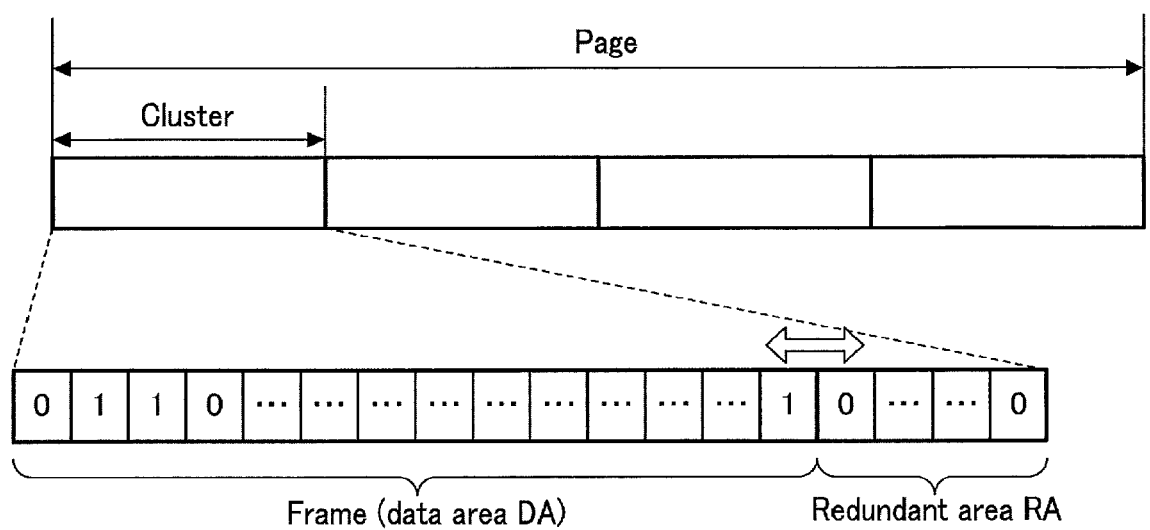
FIG. 2 is a schematic view for describing a data structure of data of the first embodiment.

In general, according to one embodiment, a memory system includes a memory device including a plurality of first storage elements configured to store data, a temperature sensor configured to measure a temperature of the memory device, and a controller. The controller includes a processor configured to acquire a current temperature from the temperature sensor as a first temperature, acquire a temperature when the data is written into the first storage element, from the memory device as a second temperature, determine whether a difference between the first temperature and the second temperature exceeds a predetermined temperature difference, and when the difference exceeds the predetermined temperature difference, instruct the memory device to rewrite the data written in the first storage element. The memory device includes a sequencer configured to determine a voltage for the rewrite, based on the difference and a voltage when the data is written into the first storage element.

In the following description, components with substantially the same functionalities and configurations will be referred to with the same reference numerals, and repeated descriptions may be omitted. All descriptions for a particular embodiment also apply to another embodiment unless explicitly mentioned otherwise or obviously eliminated. Each functional block can be implemented as hardware, computer software, or the combination of the both. It is not necessary that functional blocks are distinguished as in the following examples. For example, some of the functions may be implemented by functional blocks different from those illustrated below. Any step in a flow of a method of an embodiment is not limited to any illustrated order, and can occur in an order different from an illustrated order and/or can occur concurrently with another step unless stated otherwise.

A phrase of a particular first component being "coupled" to another second component herein includes the first component being coupled to the second component either directly or via one or more components which are always or selectively conductive.

First Embodiment

<1.1. Configuration (Structure)>
<1.1.1. Memory System>

FIG. 1 is a functional block diagram of a memory system 1 of a first embodiment. The memory system 1 serves as a storage for a host device 2. The memory system 1 communicates with the host device 2. The memory system 1 stores and reads data from and to the host device 2 based on instructions of the host device 2.

The host device 2 may be, for example, a server computer or a personal computer. The host device 2 performs information processing and uses the memory system 1 to store data. The host device 2 divides the memory space provided by the memory system 1 into plural logical areas, and adds a logical address to each logical area. The host device 2 manages the memory space of the memory system 1 by using the logical addresses. When the host device 2 determines that write-target data will be stored in a particular logical area, the host device 2 assigns the determined logical address to the write-target data. The host device 2 instructs the memory system 1 to write the write-target data to the logical area identified by the logical address. The host device 2 specifies read-target data in the memory system 1 with a logical address.

The memory systems 1 is configured as, for example, a memory card such as an SD™ card, a solid state device (SSD), or the like. The memory system 1 includes plural memory devices 100 and a memory controller 200. The memory devices 100 and the memory controller 200 may be separate chips sealed, for example, by resin, into respective separate packages, or may be in one chip.

The memory devices 100 have the same components and connections. Hereinafter, one memory device 100 is described as a representative. The descriptions for the representative memory device 100 apply to other memory devices 100. The memory device 100 stores data in a non-volatile manner. The memory device 100 may be, for example, a NAND flash memory.

The memory controller 200 receives commands from the host device 2, and controls the memory device 100. The control of the memory device 100 includes one irrelevant to commands received from the host device 2, and one based on commands received from the host device 2. For example, the memory controller 200 writes data, which the memory controller 200 is instructed to write by the host device 2, into the memory device 100. The memory controller 200 reads data, which the memory controller 200 is instructed to read by the host device 2, from the memory device 100, and transmits the same to the host device 2.

The memory controller 200 manages the memory devices 100. The management includes management of address mapping, and management of the states of the memory devices 100. The address mapping is one between logical addresses and physical addresses. A physical address is information to identify a memory area provided by the memory device 100. Specifically, when instructed to perform a write, the memory controller 200 manages the write destination logical address of the write-instructed data and the physical address of the memory area in the memory device 100 in which that data has been written, with the address mapping table. When the memory controller 200 is instructed from the host device 2 to read data from memory area of a particular logical address, it refers to the address mapping table and acquires the physical address associated with that logical address. The memory controller 200 reads data from the memory area of the acquired physical address in the memory device 100. The management of the state of the memory device 100 includes management of memory areas (i.e., one or more blocks BLK, to be described below) of the memory device 100, wear leveling, garbage collection, and refresh.

<1.1.2. Memory controller>

The memory controller 200 includes a host interface 21, an overall controller 22, a random access memory (RAM) 23, a memory interface 24, an error correction code (ECC) circuit 25, and a read only memory (ROM) 26. In FIG. 1 and other drawings, the interface is described as IF. The memory controller 200 includes, for example, a processor, such as a central processing unit (CPU), as hardware. The memory controller 200 performs some or all of functions of each of the host interface 21, the overall controller 22, the memory interface 24, and the ECC circuit 25 when firmware (i.e., program) stored in the ROM 26 and loaded onto the RAM 23 is executed by the processor. The host interface 21, the overall controller 22, the RAM 23, the memory interface 24, the ECC circuit 25, and the ROM 26 are coupled to each other by a bus. The memory controller 200 transmits an instruction to a temperature sensor 17 included in the memory device 100, and acquires temperature data described later from the temperature sensor 17.

The host interface 21 includes hardware components and/or software to couple the memory controller 200 and the host device 2 communicatively in accordance with a particular communications standard. Specifically, the host interface 21 includes hardware for physical connection, for example, connectors and/or pins, via a bus with the host device 2, and is coupled to the host device 2 via the bus. The host interface 21 performs various processes to enable the memory controller 200 and the host device 2 to communicate in accordance with the communications standard to which the host interface 21 conforms. Examples of the host interface 21 and/or the communications standard to which the host interface 21 conform include Advanced Technology Attachment (ATA), Serial ATA (SATA), Serial Attached Small computer system interface (SAS), and Peripheral Component Interconnect Express (PCIe).

The RAM 23 temporarily stores data and serves as a buffer. The data includes: data received from the host device 2; data to be transmitted to the host device 2; data to be written into the memory device 100 (also referred to as write data); data read from the memory device 100 (also referred to as read data); various management data which indicates the states of the memory devices 100 and is referred to by the overall controller 22 for controlling the memory device 100; and firmware. The management data includes the address mapping table. The RAM 23 stores plural units of memory device temperature information 231. Each of the units of memory device temperature information 231 includes temperature information on one or more corresponding memory devices 100. The memory device temperature information 231 will be described in full detail below.

The memory interface 24 is physically coupled to the memory device 100 by a NAND bus, and transmits and receives signals between the memory devices 100 in accordance with a NAND interface. The NAND bus transmits signals in accordance with the NAND interface. The signals according to the NAND interface include various control signals, input/output signals DQ, and a ready busy signal, for example. The input/output signals DQ (i.e., DQ0 to DQ7) have a width, for example, of eight bits, and include commands CMD, write data and read data DATA, address signals ADD, and various kinds of management data. The ready busy signal is independent for each memory device 100. The ready busy signal indicates that the memory devices 100 transmitting the corresponding ready busy signal are in a ready or busy state, for example, with a logical high or low, respectively. The memory device 100 receives commands from the memory controller 200 in the ready state, and does not receive commands from the memory controller 200 in the busy state.

The ECC circuit 25 generates error correction data for correcting errors of particular substantial data. The substantial data includes data instructed to be written by the host device 2 and management data. The error correction data may be generated by any known methods. The error correction data includes, for example, parity data. The set of substantial data and corresponding error correction data is written into the memory device 100 as write data. A technique for generating error correction data and the size of the same determine the number of correctable errors of corresponding substantial data. In general, the larger the error correction data, the more the correctable errors, i.e., the larger error correction capability. The ECC circuit 25 selects one of plural error correction capabilities, and can generate the error correction data for the selected error correction capability.

The ECC circuit 25 performs operations to data read from the memory device 100, and attempts to acquire correct data (i.e., error-corrected data) in the read data, such as host read data or management data. The ECC circuit 25 can acquire correct substantial data from the read data when the read data includes errors less than an error correction capability which depends on the error correction data included in the read data.

The overall controller 22 is implemented by some of the functions of the processor and the RAM 23, for example. The overall controller 22 controls the host interface 21, the RAM 23, the memory interface 24, and the ECC circuit 25. The overall controller 22 manages the above address mapping and/or the states of the memory devices 100 while controlling the RAM 23 and the memory interface 24 in reads and writes.

<1.1.2.1. ECC Circuit>

The ECC circuit 25 can change the size of error correction data for substantial data including data instructed to be written by the host device 2 and management data to change the number of correctable error bits in the substantial data.

The ECC circuit 25 divides received substantial data into segments (also referred to as frames) of a particular size, and outputs the set of frame and corresponding error correction data. The set of frame and corresponding error correction data is referred to as a cluster.

FIG. 2 is a schematic view for describing a data structure of data of the first embodiment. The size of a cluster is fixed. As illustrated in FIG. 2, the size of a cluster, for example, is as large as one of plural (for example, four) equally-sized segments of one page of the memory device 100. In contrast, the size of error correction data is variable based on the error correction capability required for the corresponding frame. Therefore, the size of a frame occupying one cluster is variable based on the error correction capability.

The ECC circuit 25 divides to-be-written substantial data into plural frames of a size equal to the size of a cluster minus the size of the error correction data which realizes the error correction capability currently set for the ECC circuit 25. The ECC circuit 25 uses such a frame to generate corresponding error correction data. As a result, the set of error correction data of the size based on the error correction capability and a frame has the same size as a cluster. The higher a required error correction capability, the larger a size of the necessary error correction data, i.e., the smaller a frame. Therefore, the higher an error correction capability for error correction data used, the smaller the corresponding frame.

Hereinafter, in the memory device 100, an area including a cell transistor MT in which substantial data is written in a frame is referred to as a data area DA, and an area including a cell transistor MT in which error correction data is written is referred to as a redundant area RA.

The ECC circuit 25 basically determines the data area DA and the redundant area RA which occupy the cluster in this manner. In the present embodiment, as described below in detail, in addition to the error correction data, write temperature information is also recorded in the redundant area RA. Therefore, when dividing the substantive data to be written to plural frames, the ECC circuit 25 considers the size of write temperature information in addition to the size of the error correction data which realizes the error correction capability currently set in the ECC circuit 25. The write temperature information may be, for example, one bit if it indicates only a low temperature range or a high temperature range previously determined by a selected temperature. When the write temperature information is recorded in numerical values such as Celsius or Fahrenheit, the size of plural bits is required. In the present embodiment, the temperature will be described as being recorded in numerical values.

<1.1.3. Memory Device>

Each memory device 100 includes components, such as a memory cell array 11, a sequencer 12, a potential generator 13, a driver 14, a row decoder 15, a sense amplifier 16, and a temperature sensor 17.

The memory cell array 11 includes plural blocks (i.e., memory blocks) BLK (i.e., BLK0, BLK1, . . . ), and a high reliability area HRA. Each block BLK is a physical unit of the memory cell array 11. Data in each block BLK is erased together. Each block BLK includes plural cell transistors. The cell transistors store write data from the memory controller 200 in a non-volatile manner. The high reliability area HRA will be described below.

The potential generator 13 is a circuit which generates various potential differences, i.e., voltages. The potential generator 13 supplies the generated voltages to the driver 14, the sense amplifier 16, and the like.

The driver 14 receives the address signals ADD from the memory controller 200, and selects some of the supplied voltages based on the address signals ADD. The driver 14 supplies the selected voltages to the row decoder 15.

The row decoder 15 receives the address signals ADD from the memory controller 200, and selects one block BLK based on the address signals ADD. The row decoder 15 supplies power to the selected block BLK.

The sense amplifier 16 senses voltages from the cell transistors. In addition, the sense amplifier 16 transfers write data to the cell transistors.

The temperature sensor 17 is a sensor which measures the temperature of the memory device 100. The temperature sensor 17 measures the temperature of the memory device 100 at a particular interval, for example. The temperature sensor 17 transmits temperature information MND indicating the measured temperature to the sequencer 12 in response to a request from the sequencer 12.

The sequencer 12 is controller which controls the potential generator 13, the driver 14, the sense amplifier 16, and the like based on the commands CMD from the memory controller 200. The sequencer 12 includes a register 121. The register 121 includes plural memory areas. Each memory area can be specified by the unique address and can store information of one or more bits. The register 121 stores various data in each memory area. The stored data includes the temperature information MND. The temperature information MND includes data indicating temperature (also refer to as temperature data).

Figure 3:
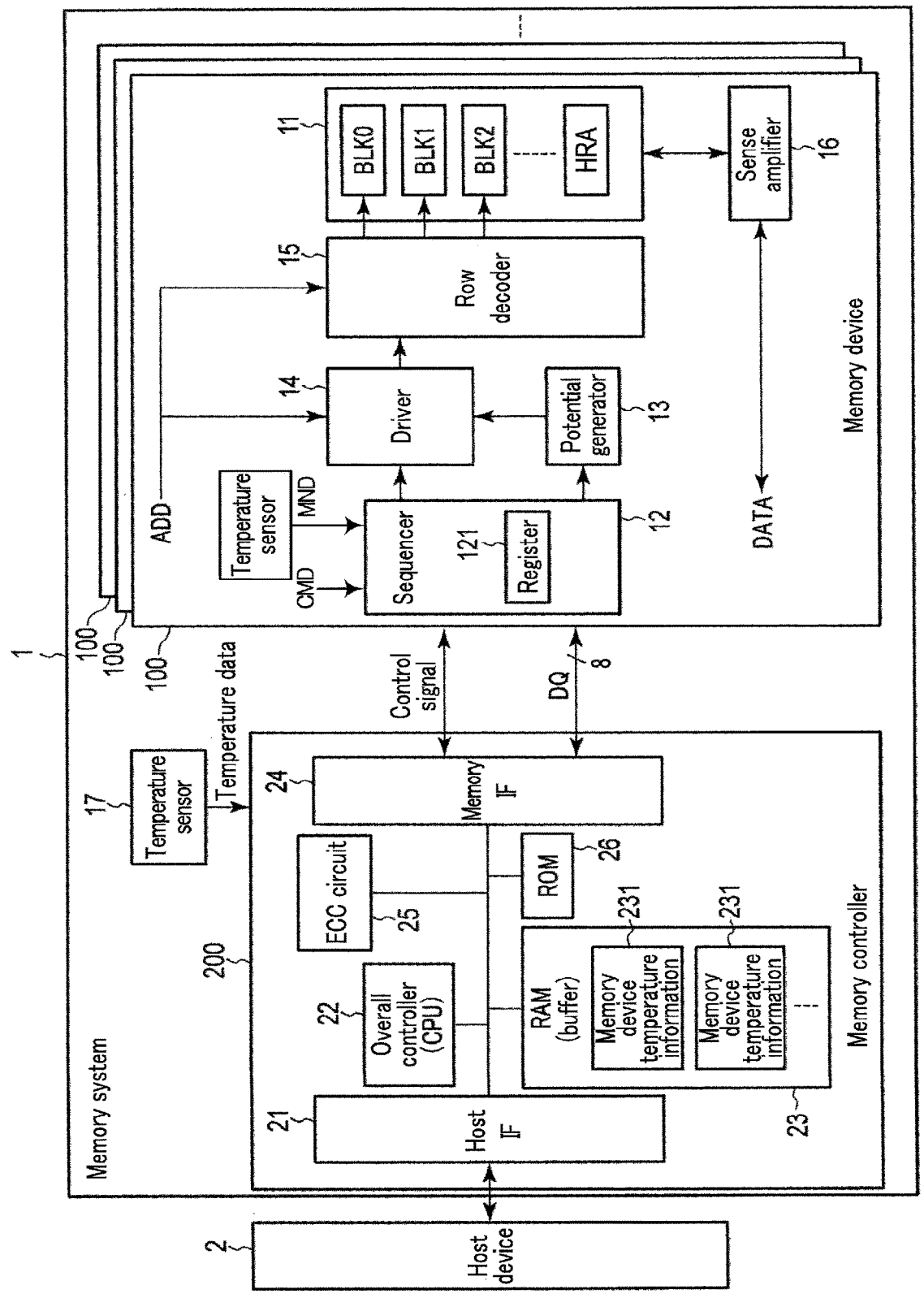
FIG. 3 is another functional block diagram of a memory system of the first embodiment.

FIG. 3 is another functional block diagram of the memory system 1 of the first embodiment. As illustrated in FIG. 3, the temperature sensor 17 may be provided separately from the memory device 100 of the memory system 1. In this case, the memory controller 200 transmits an instruction to the temperature sensor 17 provided separately from the memory device 100, and acquires temperature data from the temperature sensor 17.

<1.1.3.1. Cell Array>

FIG. 4 is a circuit diagram of the block BLK0 of the first embodiment. FIG. 4 illustrates components and connections of the block BLK0 of the memory cell array 11, and associated components. Blocks BLK other than the block BLK0 include the same elements and connections as the block BLK0 illustrated in FIG. 4.

The block. BLK0 includes plural (for example, four) string units SU (i.e., SU0 to SU3).

In the block BLK0, each of m bit lines BL0 to BLm-1 is coupled to one of respective strings STR from the four string units SU0 to SU3. The m is a natural number.

Each string STR includes one select gate transistor ST, plural (for example, eight) cell transistors MT (i.e., MT0 to MT7), and one select gate transistor DT (i.e., DT0 to DT3). The select gate transistor ST, the cell transistors MT, and the select gate transistor DT are coupled in series in this order between a source line CELSRC and one bit line BL. A cell transistor MT includes a control gate electrode, i.e., word line WL, and a charge storage layer insulated from the environment. The cell transistor MT can store data in a non-volatile manner based on the quantity of the electric charge in the charge storage layer. A cell transistor MT has electrons injected into its charge storage layer by a write, and has electrons drawn out from the charge storage layer by an erasure.

Plural strings STR respectively coupled to plural bit lines BL make plural string units SU (i.e., SU0, SU1, SU2, and SU3). Each string unit SU includes a string STR coupled to one bit line BL, one for each bit line BL. In each string unit SU, control gate electrodes of the cell transistors MT0 to MT7 are coupled to the word lines WL0 to WL7, respectively. Word lines WL with the same address in the different string units SU are also coupled to each other. A set of cell transistors MT which share the word line WL in one string unit SU is referred to as a cell unit CU. The cell transistors MT in one cell unit CU have data written into and read together. The memory area of one cell unit CU includes one or more pages.

The select gate transistors DT0 to DT3 belong to the string units SU0 to SU3, respectively. For each a, the gate of each select gate transistor DTa of each of strings STR in a string unit SUa is coupled to a select gate line SGDLα. The α is 0 or a natural number smaller than four. The gates of the select gate transistors ST are coupled to a selected gate line SGSL.

A block BLK can have any physical structure. That is, the block BLK may use a so-called two-dimensional structure in which the word lines WL having different addresses are arranged on the same plane. The block BLK may use a so-called three-dimensional structure in which the word lines WL of planar shape with different addresses are stacked in the vertical direction.

Figure 5:
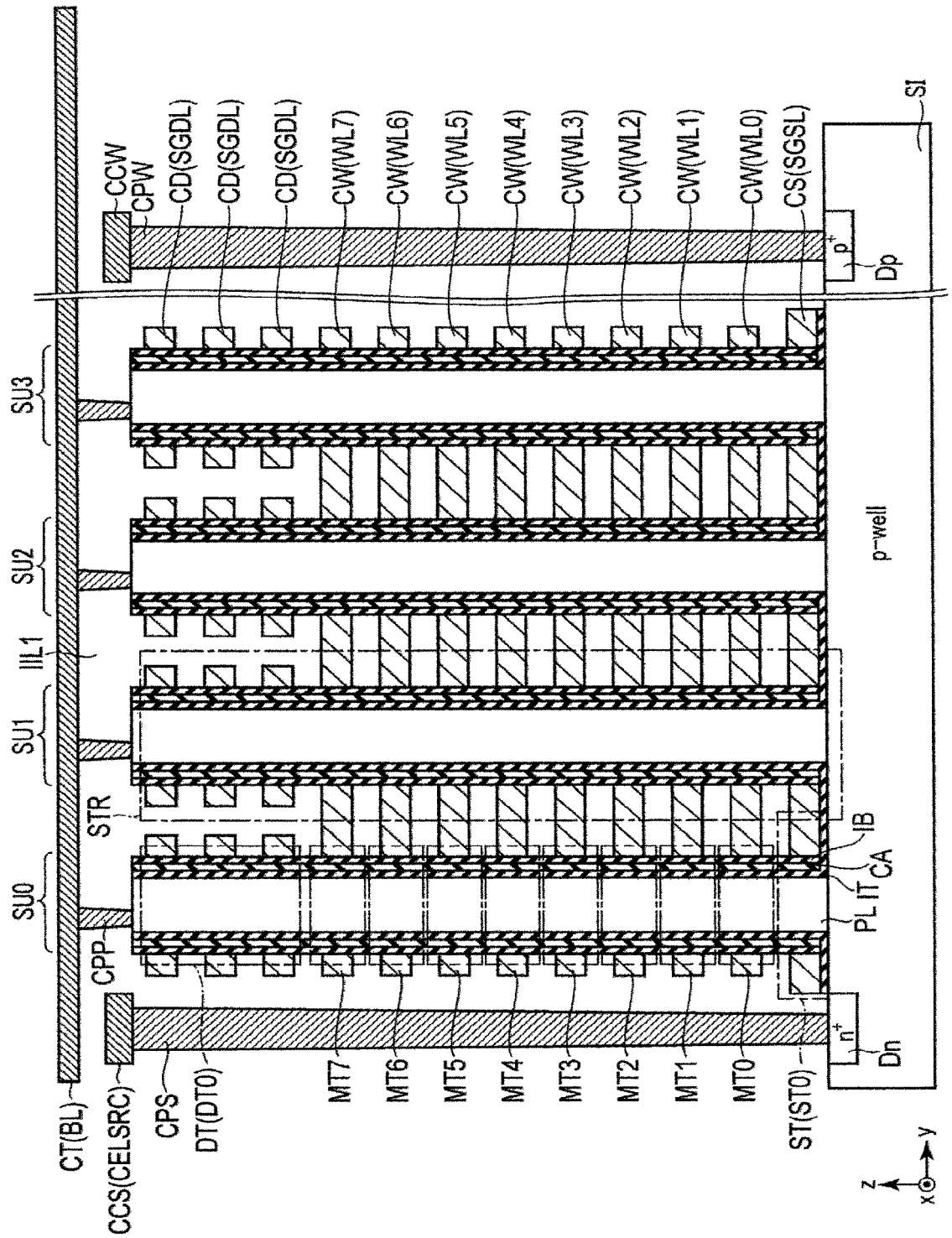
FIG. 5 is a schematic view illustrating an example of a physical structure of the block of the first embodiment.

FIG. 5 is a schematic view illustrating an example of the physical structure of the block BLK. The upward direction of FIG. 5 is the z-axis direction, the rightward direction of FIG. 5 is the y-axis direction, and the frontward direction perpendicular to the paper surface of FIG. 5 is the x-axis direction. Each block BLK can have the structure illustrated in FIG. 5. In the example illustrated in FIG. 5, the string units SU are provided on a silicon substrate SI. The silicon substrate SI extends along the xy-plane, and includes a p-type well, i.e., p-well. The p-well is formed inside the silicon substrate SI, for example, by implanting ions to the entire surface of the silicon substrate SI. Each string unit SU includes plural strings STR lined up along the x-axis. Each string STR includes a semiconductor pillar PL. Each pillar PL extends along the z-axis and is in contact with the p-well at its bottom. The pillar PL serves as a channel region in which channels of the transistors MT, DT, and ST are formed and a body. The top of the pillar PL is coupled to a conductor CT via a conductive plug CPP. The conductor CT extends along the y-axis and serves as one bit line BL. The conductor CT has an interval with another conductor CT located at another coordinate on the x-axis. The side of the pillar PL is covered with a tunnel insulator (i.e., tunnel insulator layer) IT. The tunnel insulator IT is also located on the p-well. The side of the tunnel insulator IT is covered with a charge storage layer CA. The charge storage layer CA is insulative or conductive, and has its side covered with a block insulator (i.e., block insulator layer) IB.

In each string unit SU, one conductor CS, plural (for example, eight) conductors CW, and plural (for example, three) conductors CD are provided above the p-well. Plural conductors CS may be provided. The conductors CS, CW, and CD are lined up in this order along the z-axis at intervals, extend along the x-axis, and are in contact with the block insulator IB. The conductor CS also sandwiches the tunnel insulator IT with the p-well. The conductors CS, CW, and CD serve as a select gate line SGSL, word lines WL0 to WL7, and a select gate line SGDL, respectively. In each string unit SU, the conductors CS, CW, and CD are at their insides in contact with the block insulators IB on the sides of all the pillars PL in that string unit SU.

A pillar PL, a tunnel insulator IT, a charge storage layer CA, and sections of a block insulators IB at crossings with the conductors CS, CW, or CD serve as a select gate transistor ST, a cell transistor MT, or a select gate transistor DT, respectively. The transistors ST, MT, and DT which share a pillar PL and are lined up along the z-axis make one string STR.

A diffusion layer of p+-type impurities Dp is provided in the p-well. The diffusion layer Dp is coupled to a conductor CCW via a conductive plug CPW. The plug CPW extends along the xz-plane.

A diffusion layer of n+-type impurities Dn is further provided in the p-well. The diffusion layer Dn is coupled to a conductor CCS via a conductive plug CPS. The conductor CCS serves as the source line CELSRC.

An area above the silicon substrate SI and provided without the conductors CS, CW, CD, CCS, and CCW, and the plugs CPS and CPW, is provided with an insulator IIL1.

<1.1.3.2. Cell Transistor>

The memory device 100 can store data of one or more bits in one cell transistor MT. A storage element which stores one bit of data per cell transistor as a result of writing is referred to as a single-level cell (SLC). On the other hand, there are a multi-level cell (MLC) which stores two bits of data per cell transistor, a triple-level cell (TLC) which stores three bits of data per cell transistor, and a quad-level cell (QLC) which stores four bits of data per cell transistor. It can be said that the storage element has a large data capacity as the number of bits per cell transistor increases. As compared with MLC, TLC, and QLC, SLC can be said to be a memory element which is excellent in accuracy and durability because it is less likely to cause errors when reading and writing data and has less change in characteristics due to temperature change.

FIG. 6 is a schematic view illustrating an example of data storage in the memory device 100 of the first embodiment. FIG. 6 illustrates the distribution of threshold voltages of plural cell transistors MT storing two bits of data per cell transistor. In FIG. 6, four distributions are illustrated. The vertical axis is the number of cell transistors MT, and the horizontal axis is the potential (V), i.e., potential difference with the ground. The threshold voltage is a voltage required for the cell transistor MT to conduct, and changes according to the stored charge.

The distribution of threshold voltages of the cell transistors MT in which a constant voltage is applied to the control gate electrode forms a normal distribution. The states of the cell transistors MT belonging to each of the four distributions of FIG. 6 are referred to as an Er state, an A state, a B state, and a C state from the left side of the four distributions, respectively. The Er state, the A state, the B state, and the C state are treated as states for storing, for example, data "11", data "01", data "00", and data "10", respectively. The Er state is also referred to as the erased state. Data is written into Er-state cell transistors MT. As a result of this write, the cell transistors MT transits from the Er state to the A state, the B state, or the C state.

It is determined that the cell transistor MT having the threshold voltage in the area of less than the read voltage VA (=0 V) is in the Er state. It is determined that the cell transistor MT having the threshold voltage in the area of the read voltage VA or more and less than the voltage VB is in the A state. It is determined that the cell transistor MT having the threshold voltage in the region of the read voltage VB or more and less than the voltage VC is in the B state. It is determined that the cell transistor MT having the threshold voltage in the area of the read voltage VC or more is in the C state. The cell transistor MT is conducted by applying the read voltage greater than or equal to the threshold voltage to its control gate electrode. Vread is applied to the control gate electrode of the non-read target cell transistor MT. The value of Vread is set to a value that causes the cell transistor MT most filled with electrons to conduct as well.

When two bits of data per cell transistor are stored, the same set of bits among two bits (i.e., upper bit and lower bit) of each of the cell transistors MT in one cell unit CU constitutes a page. Specifically, a set of upper bits constitute an upper page, and a set of lower bits constitute a lower page.

In order to verify the completion of the write to the cell transistor MT, a verify voltage AV, BV or CV is used. The verify voltages AV, BV, and CV may be collectively referred to as the verify voltage.

Data of three bits or more can also be stored by one cell transistor MT by extension of the technique described so far. In the case of the SLC in which one bit of data is stored per one cell transistor, only the Er state and any one of the A state, the B state, and the C state of FIG. 6 are used.

<1.1.3.3. High Reliability Area>

The high reliability area HRA refers to an area in which the reliability of data reading with respect to the temperature change is higher than that of the data area DA. For example, the high reliability area HRA is a SLC block (i.e., block used to store one bit of data per cell transistor), a block written every other word line, or an area protected by a strong error correction function. Therefore, one high reliability area HRA may operate as one or more blocks.

<1.2. Operation>

Figure 7:
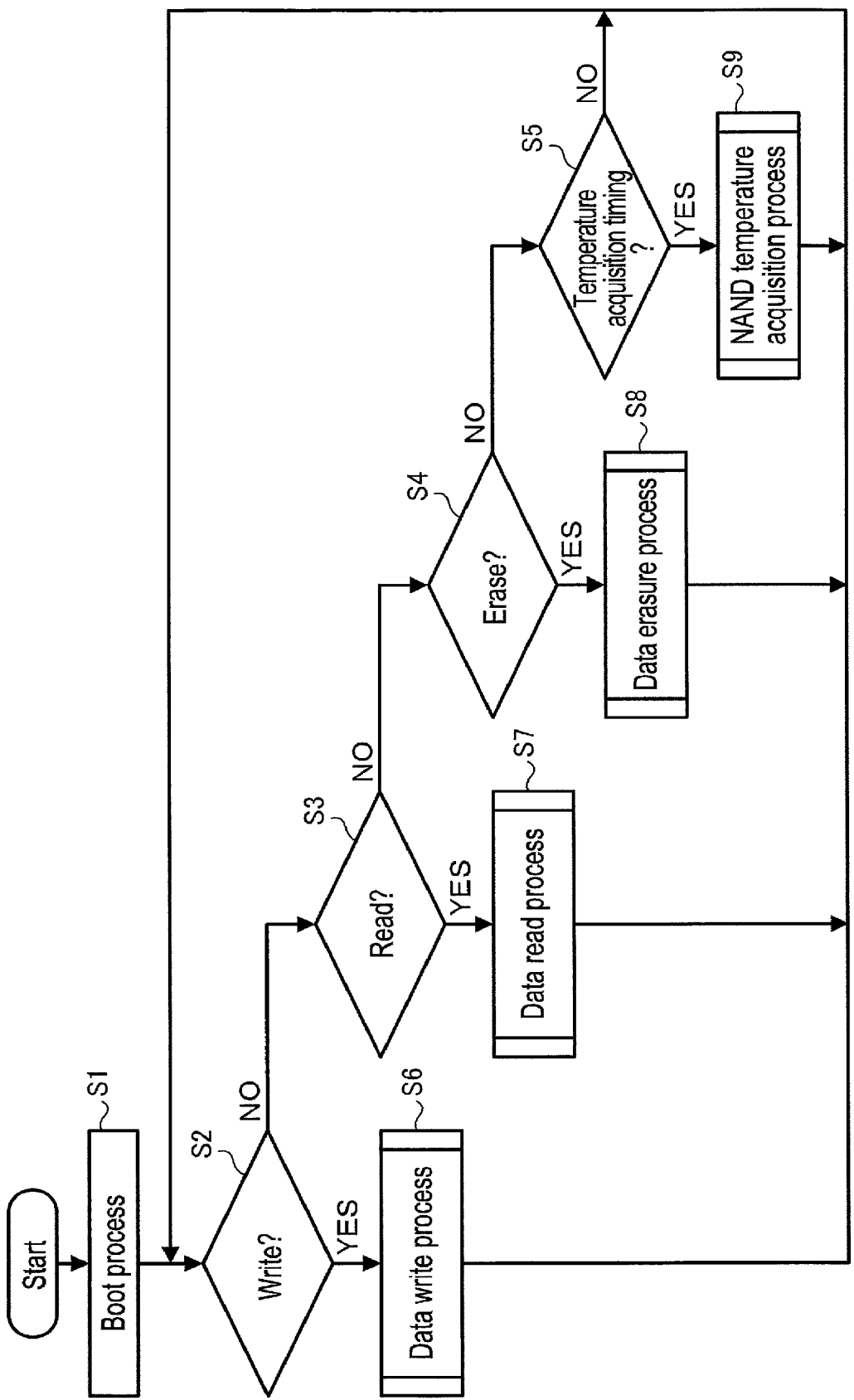
FIG. 7 is a flowchart illustrating an example of the operation of the memory system of the first embodiment.

FIG. 7 is a flowchart illustrating an example of the operation of the memory system 1 of the first embodiment. In the example illustrated in FIG. 7, for example, when the memory system 1 starts to receive supply of power and boots, the memory system 1 performs a boot process (step S1). The boot process refers to a required process necessary for the memory system 1 to be able to write and read data. The boot process includes creating various tables in the memory controller 200. In the present embodiment, a write temperature table is created in the memory controller 200 as the boot process.

Data necessary for creating the tables is stored in one or more blocks BLK of the memory cell array 11 in each memory device 100. The memory controller 200 reads necessary data from those blocks BLKs of the entire memory device 100, and uses the read data to create tables for each memory device 100 on the RAM 23. The tables to be created include the address mapping table and the write temperature table illustrated in FIG. 8. The write temperature table for each memory device 100 is included in the memory device temperature information 231 for the memory device 100 on the RAM 23.

Figures 8, 9:
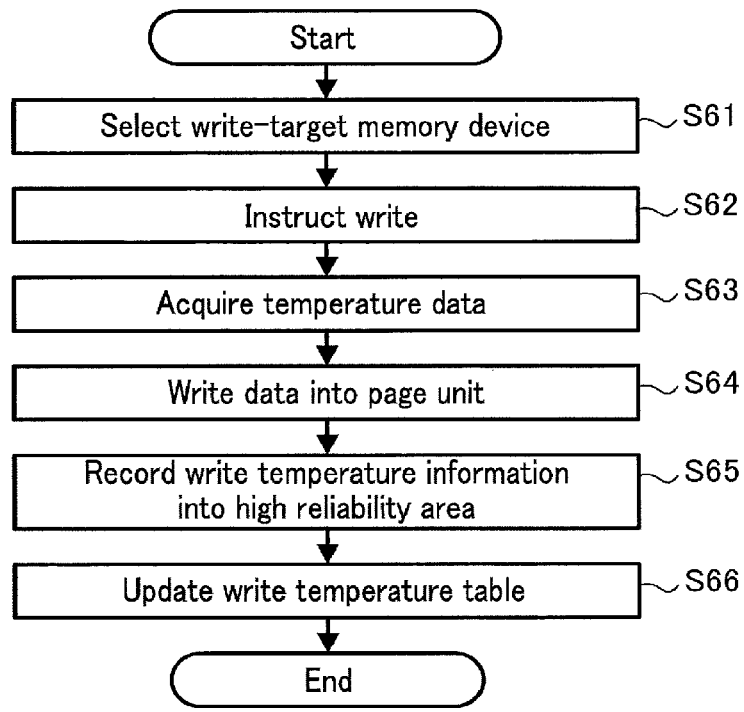
FIG. 8 is a table for describing a data structure of a write temperature table in the first embodiment.
FIG. 9 is a flowchart illustrating details of a data write process of the first embodiment.

FIG. 8 is a table for describing the data structure of the write temperature table in the first embodiment. As illustrated in FIG. 8, the write temperature table indicates the correspondence between the address of each page and the write temperature of the page acquired from the temperature information measured by the temperature sensor 17 at the time of the write to the cell unit CU of the page.

Whenever data is written into the cell unit CU, the overall controller 22 acquires temperature information measured by the temperature sensor 17 as a write temperature corresponding to the page of the cell unit CU, and updates the write temperature table. This point will be described below in detail.

The description returns to FIG. 7. The memory system 1 performs various processes following step S1. Specifically, the overall controller 22 of the memory controller 200 repeats the determination process of steps S2 to S5 while the memory system 1 is supplied with power and turned on. In step S2, the overall controller 22 determines whether to write data into the memory device 100. When the overall controller 22 determines that the data is not written into the memory device 100 (i.e., NO in step S2), the overall controller 22 proceeds to the determination process of step S3. In step S3, the overall controller 22 determines whether to read data from the memory device 100. When the overall controller 22 determines that the data is not read from the memory device 100 (i.e., NO in step S3), the overall controller 22 proceeds to the determination process of step S4. In step S4, the overall controller 22 determines whether the data written in the memory device 100 is to be erased. When the overall controller 22 determines that the data written in the memory device 100 is not erased (i.e., NO in step S4), the overall controller 22 proceeds to the determination process of step S5. In step S5, the overall controller 22 determines whether it is a temperature acquisition timing. When the overall controller 22 determines that it is not the temperature acquisition timing (i.e., NO in step S5), the overall controller 22 returns to the determination process of step S2.

In step S2, when the overall controller 22 determines that data is to be written into the memory device 100 (i.e., YES in step S2), it performs the data write process (step S6). The determination to write data into the memory device 100 in the overall controller 22 is made based on a write instruction from the host device 2 or in garbage collection. In order for the memory controller 200 to write management data into the memory device 100, the overall controller 22 may determine to write data into the memory device 100 without an instruction from the host device 2.

FIG. 9 is a flowchart illustrating details of the data write process of the first embodiment. The overall controller 22 selects the write-target memory device 100 (step S61). The overall controller 22 controls the memory interface 24 to transmit a write control signal to the memory device 100 selected in step S61 (step S62). The overall controller 22 divides the substantial data to be written into the memory device 100 into frames of a size determined based on the required correction capability and the form of write temperature information. The overall controller 22 may determine the required correction capability based on the nature of the substantial data or the reliability of the cell unit CU to which the substantial data is written. The overall controller 22 then controls the ECC circuit 25 to generate error correction data for each frame. Therefore, write data including plural frames and error correction data is prepared.

The write control signal includes a write command, a write destination address, and a write execution command, for example. The write destination address is an address of a cell unit CU which is the write destination of the write data. For example, in the case of the write to the MLC, a write control signal indicating the address of two pages (i.e., one cell unit CU) as the write destination address is transmitted to the memory device 100.

When the memory device 100 receives the write control signal, the sequencer 12 of the memory device 100 acquires temperature information MND including data indicating temperature (i.e, temperature data) from the temperature sensor 17, and stores the temperature information MND in the register 121 (step S63). Next, the sequencer 12 controls the potential generator 13, the driver 14, the row decoder 15, and the sense amplifier 16 to write the write data to the specified cell unit CU and write the acquired temperature data as the write temperature information (step S64). A frame which is substantial data in the write data is written into the data area DA. The error correction data in the write data and the write temperature information are written into the redundant area RA.

When the write in step S64 is completed, the sequencer 12 writes the write temperature information recorded in the redundant area RA together with the page address information into the high reliability area HRA (step S65). The page address information and the write temperature information written in the high reliability area HRA in step S65 are used to create a write temperature table as illustrated in FIG. 8. The high reliability area HRA records the information of each entry of the write temperature table, and one entry is written in step S65.

The sequencer 12 transmits, to the memory controller 200, the address information and the temperature data which is write temperature information written in the high reliability area HRA in step S65. The overall controller 22 of the memory controller 200 updates the write temperature table included in the memory device temperature information 231 on the RAM 23 based on the information transmitted from the sequencer 12 (step S66). Then, the data write process is ended (i.e., END in FIG. 9).

In step S3, when the overall controller 22 of the memory controller 200 determines that data is to be read from the memory device 100 (i.e., YES in step S3), the overall controller 22 performs the data read process (step S7). The determination to read data from the memory device 100 in the overall controller 22 is made based on a read instruction from the host device 2 or in garbage collection. The overall controller 22 may determine to read data from the memory device 100, not based on an instruction from host device 2 but based on the determination that the memory controller 200 reads management data from the memory device 100.

In the data read process, the overall controller 22 of the memory controller 200 specifies a page in which data to be read is stored. The overall controller 22 controls the memory interface 24 to transmit, to the memory device 100, a control signal for reading from the specified page. When the storage scheme is a single level cell (SLC), the page specification is equivalent to the cell unit CU. Hereinafter, the processing-target cell unit CU is referred to as CUy. The read control signal includes, for example, a read command, an address specifying a cell unit CUy, an address specifying a page, and a read execution command. When the memory device 100 receives the read control signal, the sequencer 12 of the memory device 100 reads data from the specified cell unit CUy. The memory device 100 transmits the read data to the memory controller 200.

In step S4, when the overall controller 22 of the memory controller 200 determines that data is to be erased from the memory device 100 (i.e., YES in step S4), the overall controller 22 performs the data erasure process (step S8). The determination to erase data from the memory device 100 is based on, for example, an instruction from the host device 2. The determination to erase data from the memory device 100 may be based on a determination by the overall controller 22 without being based on an instruction from the host device 2. For example, regardless of the instruction from host device 2, in order for the movement of substantial data including garbage collection and refresh, the overall controller 22 copies data in a particular block BLK in the memory device 100 to another block BLK, and determines to erase the data of the copy source.

FIG. 10 is a flowchart illustrating details of the data erasure process of the first embodiment. In the data erasure process, the overall controller 22 of the memory controller 200 selects the erasure-target memory device 100 (step S81). The overall controller 22 controls the memory interface 24 to transmit an erase control signal to the memory device 100 selected in step S81 (step S82).

The erasure control signal includes, for example, an erasure command and an address specifying the erasure-target block BLK. Hereinafter, the processing-target block BLK is referred to as BLKx.

When the memory device 100 receives the erasure control signal, the sequencer 12 of the memory device 100 controls the potential generator 13, the driver 14, the row decoder 15, and the sense amplifier 16 to erase the data of the specified block BLKx (step S83). The sequencer 12 erases the page address information and the write temperature information in the high reliability area HRA corresponding to the block BLKx from which the data is erased in step S83 and transmits an erasure completion signal to the memory controller 200 (step S84).

The overall controller 22 of the memory controller 200 updates the write temperature table in the memory device temperature information 231 of the RAM 23 corresponding to the specified block BLKx (step S85). Thus, the data erasure process is ended (i.e., END in FIG. 10).

The operation of step S84 and the operation of step S85 may be performed in reverse order, or may be performed in parallel. The operation of step S85 may be performed after verifying that erasure in the selected memory device 100 is completed.

In step S5, when the overall controller 22 of the memory controller 200 determines that the temperature acquisition timing has come (i.e., YES in step S5), the overall controller 22 performs the NAND temperature acquisition process (step S9). The temperature acquisition timing is a predetermined interval timing, such as 1 second, 10 seconds, or 1 minute, which is defined selectively according to various conditions such as capacity, design, or usage environment required by the memory system 1. The temperature acquisition timing can be based on other indicators, such as the number of accesses of the entire memory system 1 or the memory device 100, for example. However, the temperature change of the memory device 100 is different in the case where accesses are concentrated to one memory device 100 and the case where accesses are distributed to plural memory devices 100. Therefore, the temperature acquisition timing is preferably based on time. The temperature acquisition timing is stored in advance in the ROM 26 or the like.

Figure 11:
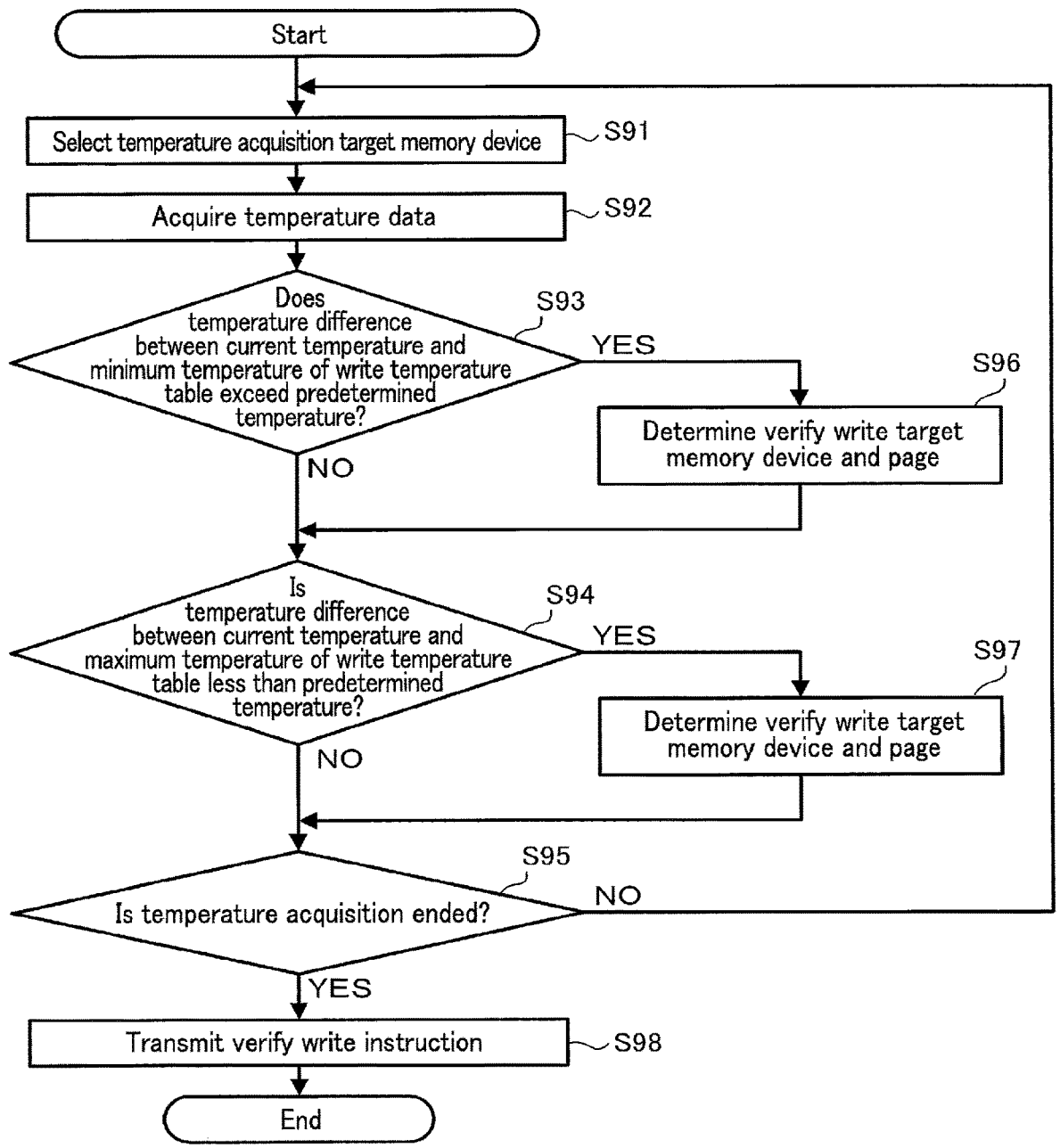
FIG. 11 is a flowchart illustrating details of a NAND temperature acquisition process of the first embodiment.

FIG. 11 is a flowchart illustrating details of the NAND temperature acquisition process of the first embodiment. The overall controller 22 selects the memory device 100 as the temperature acquisition target (step S91). The overall controller 22 acquires temperature data of the selected memory device 100 (step S92). For example, the overall controller 22 controls the memory interface 24 to instruct the selected memory device 100 to transmit temperature data. When the transmission of the temperature data is instructed, the sequencer 12 acquires current temperature information MND from the temperature sensor 17 and transmits, to the memory controller 200, data indicating the temperature (i.e., temperature data) included in the acquired temperature information MND. When the overall controller 22 of the memory controller 200 receives the temperature data, the overall controller 22 stores the current temperature of the memory device 100 indicated by the temperature data in the memory device temperature information 231 for the memory device 100 on the RAM 23.

Next, the overall controller 22 determines whether the temperature difference between the current temperature of the selected memory device 100 and the minimum temperature of the write temperature table exceeds a predetermined temperature (step S93). For example, the overall controller 22 calculates the difference between the lowest temperature of the write temperatures of each page address stored in the write temperature table of the memory device temperature information 231 for the selected memory device 100 on the RAM 23 and the current temperature stored in the same memory device temperature information 231. The overall controller 22 determines whether the difference exceeds the temperature difference indicated by the predetermined temperature. For example, when the write temperature is 0° C., the current temperature is 70° C., and the predetermined temperature is 65° C., the overall controller 22 determines that the minimum temperature of the write temperature table of the selected memory device 100 has exceeded the predetermined temperature. The predetermined temperature is defined based on various conditions such as the design, performance, usage environment, and the like of the memory system 1, and is stored and set in advance in the ROM 26 or the like.

When the overall controller 22 determines that the temperature difference between the current temperature of the selected memory device 100 and the minimum temperature of the write temperature table does not exceed the predetermined temperature (i.e., NO in step S93), the overall controller 22 determines whether the temperature difference between the current temperature of the selected memory device 100 and the maximum temperature of the write temperature table is less than the predetermined temperature (step S94). For example, the overall controller 22 determines whether the difference between the highest temperature of the write temperatures of each page address stored in the write temperature table on the RAM 23 and the current temperature exceeds the temperature difference indicated by the predetermined temperature. The predetermined temperature in this case may be the same as or different from that used in step S93.

When the overall controller 22 determines that the temperature difference between the current temperature of the selected memory device 100 and the maximum temperature of the write temperature table is not less than the predetermined temperature (i.e., NO in step S94), the overall controller 22 determines whether the temperature acquisition process for all the memory devices 100 included in the memory system 1 has been ended (step S95). When the overall controller 22 determines that there is a memory device 100 that has not been processed yet (i.e., NO in step S95), the overall controller 22 then performs step S91 described above, and selects another memory device 100 that has not yet been processed.

When the overall controller 22 determines in step S93 that the temperature difference between the current temperature of the selected memory device 100 and the minimum temperature of the write temperature table exceeds the predetermined temperature (i.e., YES in step S93), the overall controller 22 determines the memory device 100 and the page address of the page showing the lowest temperature in the write temperature table in the memory device 100 as a verify write target (step S96). The overall controller 22 stores, for example, in the RAM 23, a memory device ID for specifying the determined memory device 100 and a page address indicating the determined page. When the write is performed to plural pages immediately after the memory system 1 is booted, or when plural pages are continuously written, there may be plural pages showing the lowest temperature. After step S96, the overall controller 22 then performs step S94.

When the overall controller 22 determines in step S94 that the temperature difference between the current temperature of the selected memory device 100 and the maximum temperature of the write temperature table is less than the predetermined temperature (i.e., YES in step S94), the overall controller 22 determines the memory device 100 and the page address of the page showing the highest temperature in the write temperature table in the memory device 100 as a verify write target (step S97). There may be plural pages showing the highest temperature. The overall controller 22 stores, for example, in the RAM 23, a memory device ID for specifying the determined memory device 100 and a page address indicating the determined page. After step S97, the overall controller 22 then performs step S95.

In this way, when the overall controller 22 determines that the temperature acquisition process for all the memory devices 100 included in the memory system 1 is ended (i.e., YES in step S95), the overall controller 22 controls the memory interface 24 to transmit a verify write instruction to the memory device(s) 100 determined as the verify write target in steps S96 and S97 (step S98). The verify write instruction includes, for example, a signal specifying a page, a verify write command, and an address signal. The signal specifying the page and the address signal are generated based on the page address stored in the RAM 23 as the verify write target in steps S96 and S97. The address signal identifies the address of the cell unit CU which is the verify write destination. The signal specifying the page specifies the page to be verified. Plural pages may be specified by the signal specifying the page. In practice, in the case of the writing of two bits per cell transistor MT, a write instruction for two pages is transmitted. Then, the NAND temperature acquisition process is ended (i.e., END in FIG. 11).

As described above, the memory device 100 performs operations according to the write instruction, the read instruction, and the erasure instruction from the memory controller 200. The memory device 100 performs operations according to the verify write instruction in an idle time, i.e., when the write, read and erasure operations are not performed. Therefore, the verify write instruction received from the memory controller 200 is temporarily stored in, for example, the register 121. When the verify write instruction is executed, the instruction is erased from the register 121.

FIG. 12 is a flowchart illustrating another example of the operation of the memory device 100 of the first embodiment. When the memory device 100 is in a standby state, the memory device 100 performs the process illustrated in FIG. 12. The sequencer 12 of the memory device 100 determines whether there is a write instruction, a read instruction, or an erasure instruction (step S101). The sequencer 12 can determine it, for example, based on whether there is a write instruction, a read instruction, or an erasure instruction from the memory controller 200 in the command register such as the register 121. When the sequencer 12 determines that there is the write instruction, the read instruction, or the erasure instruction (i. e., YES in step S101), the memory device 100 performs a process based on the write instruction, the read instruction, or the erasure instruction, that is, the write, the read, or the erasure (step S102). After step S102, the sequencer 12 transits to the standby state and ends the process (i.e, END in FIG. 12).

When the sequencer 12 determines that there is no write instruction, read instruction, or erasure instruction (i.e., NO in step S101), i.e., in the idle time of the memory device 100, the sequencer 12 determines whether there is a verify write instruction (step S103). This can be determined by, for example, whether there is a verify write instruction in the register 121 or the like. When the sequencer 12 determines that there is no verify write instruction (i.e., NO in step S103), the sequencer 12 transits to the standby state and ends the process (i.e., END in FIG. 12).

When the sequencer 12 determines that there is the verify write instruction (i.e., YES in step S103), the sequencer 12 determines a processing-target page of a page size based on the verify write instruction (step S104), and reads data written in the processing-target page (step S105). The sequencer 12 acquires temperature information MND including data indicating temperature (i.e., temperature data) from the temperature sensor 17 and stores the temperature information MND in the register 121 (step S106). The sequencer 12 controls the potential generator 13, the driver 14, the row decoder 15, and the sense amplifier 16 to shift write the read data to the selected cell unit CU and write the acquired temperature data as the write temperature information (step S107). The shift write will be described later.

When the sequencer 12 determines that the shift write of one page size is ended, the sequencer 12 updates the write temperature information written in the high reliability area HRA (step S108). That is, the sequencer 12 writes the write temperature information recorded in the redundant area RA into the high reliability area HRA together with the page address information. The sequencer 12 transmits the write temperature information and the page address information written in the high reliability area HRA to the memory controller 200 (step S109). In the memory controller 200, the overall controller 22 updates the contents of the write temperature table on the RAM 23 based on the transmitted information.

After step S109, the sequencer 12 determines whether all the processes of the target page included in the verify write instruction are ended (step S110). When the sequencer 12 determines that all the processes of the target page included in the verify write instruction are ended (i.e., YES in step S110), the sequencer 12 shifts to the standby state and ends the process (i.e, END in FIG. 12). When the sequencer 12 determines that all the processes of the target page included in the verify write instruction are not ended (i.e., NO in step S110), the sequencer 12 performs step S104.

FIG. 13A is a schematic view illustrating how a distribution of a threshold voltage of a cell transistor storing data is shifted due to a temperature change with respect to a time of data write. The threshold voltage of the cell transistor MT is affected by the temperature change. For example, when the temperature at the time of the data read rises significantly with respect to the time of data write, the distribution of threshold voltages of plural cell transistors MT shifts to one side or spreads as exemplified in FIG. 13A. Specifically, the probability that the data "01" stored in one cell transistor MT will be erroneously determined to be data "11" at the time of the data read increases.

FIG. 13B is a schematic view illustrating a distribution of a threshold voltage of a cell transistor by shift write. FIG. 13C is a schematic view illustrating how a distribution of a threshold voltage of a shift-written cell transistor is shifted by a temperature change with respect to a time of data write. Therefore, as exemplified in FIG. 13B, it is conceivable to shift the distribution of threshold voltages in advance. By doing this, even when the distribution of the threshold voltage deviates to one side or spreads due to the temperature at the time of the data read largely rising with respect to the time of the data write, it can be expected that the threshold voltage distribution is maintained above a predetermined read voltage VA, as exemplified in FIG. 13C. As a result, even when the temperature at the time of the data read rises significantly with respect to the time of the data write, it can be expected that the read data is determined to be "01" without erroneously determining that data "01" stored in one cell transistor MT is data "11" at the time of the data read.

However, the temperature change may occur in the reverse direction, and the distribution of threshold voltages of the cell transistors MT may shift in the reverse direction according to the temperature change, which may increase the probability of an erroneous determination.

Therefore, in the present embodiment, instead of pre-shifting, when the current temperature changes to certain degree with respect to the temperature at the time of past write, data is written again, i.e., data is rewritten in consideration of the change in physical characteristics of the memory element due to the temperature difference. The certain degree of temperature difference is the predetermined temperature used in the steps S93 and S94. In the data rewrite, the value of the voltage applied to the control gate electrode of the write-target cell transistor MT is set to a voltage value different from that of the previous write. As described above, the write performed with the magnitude of the applied voltage being different from the write performed previously is referred to as the shift write. In addition, the magnitude of the voltage applied in the data rewrite is determined based on the temperature difference of the memory device 100 between the past write time and the current time, and the voltage applied to the control gate electrode of the write-target cell transistor MT in the past write.

<1.3. Advantages>

According to the first embodiment, the memory controller 200 can control the memory device 100 more appropriately. Details are as follows.

In general, the memory device is configured by collecting a large number of storage elements. The storage element uses various physical characteristics and converts the change of its characteristics into digital data of "0" and "1" by detecting with a detector. Each storage element may have temperature dependency on its characteristics. When the characteristics of the memory element have temperature dependency, a phenomenon in which correct data cannot be read may occur due to the change in the characteristics when data written at low temperature is read at high temperature, or when data written at high temperature is read at low temperature.

According to the first embodiment, when the difference between the current temperature of the memory device 100 and the temperature of the memory device 100 at the time of writing data into the storage element exceeds a predetermined temperature difference, the memory controller 200 causes the memory device 100 to rewrite the data written in the storage element in consideration of the temperature dependence of the physical characteristics of the storage element at the time of data read. Therefore, even when the temperature greatly changes from the time of the first write, the occurrence of the phenomenon that data cannot be read correctly can be suppressed.

The memory system 1 also includes an ECC circuit 25. The ECC circuit 25 performs operations on the read data from the memory device 100 to attempt to acquire correct (error-corrected) data included in the read data. The ECC circuit 25 can acquire correct substantial data from the read data when the read data includes errors less than an error correction capability which depends on the error correction data included in the read data. Therefore, even when the correct data cannot be read due to the temperature change, it is possible to acquire correct substantial data. However, when the read data includes many errors, the error rate of the read data increases. When the memory controller 200 detects such a high error rate state, the memory controller 200 determines that the deterioration of the cell unit CU storing the read data is progressing. Then, the memory controller 200 uses error correction data capable of correcting more errors when writing another data after erasing the data in the cell unit CU determined to have progressed in deterioration. As a result, the frame is reduced and the amount of data that can be stored by the memory device 100 is reduced. As the reduced frame increases, the memory controller 200 and the memory device 100 increase the number of times of writing or reading data to the memory device 100 to read or write necessary data. This degrades the memory system 1 and shortens its life.

According to the first embodiment, as described above, correct data can be read by performing the shift write according to the temperature change, which suppresses the reduction of the error rate of the read data and, in return, the reduction of the frame. As a result, it is possible to suppress an increase in the number of times of reading or writing data in the memory device 100, and in turn, extend the life of the memory system 1. For the same reason, in the test before shipment of the memory system 1, it is avoided that the memory system 1 is erroneously determined to be prone to deterioration, whereby the yield of the memory system 1 is improved.

<1.4. Modifications>

In the first embodiment, the example in which it is determined whether the shift write is to be performed by acquiring the current temperature of the memory device 100 every predetermined time has been described. In a first modification of the first embodiment, additionally or alternatively, when data is read from the memory device 100, it may be determined whether the shift write is necessary.

Figure 14:
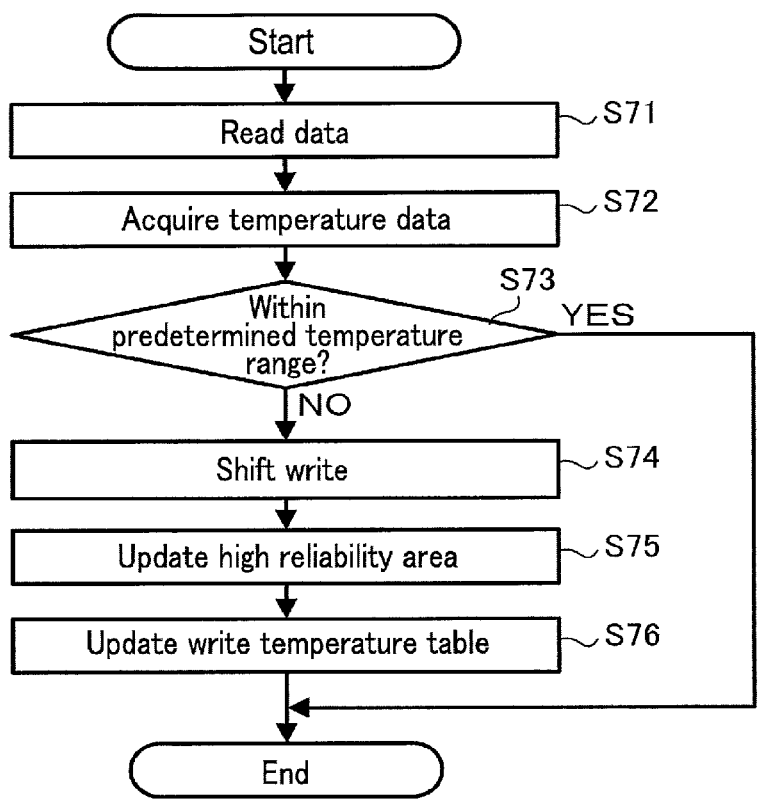
FIG. 14 is a flowchart showing details of a data read process in a first modification of the first embodiment.

FIG. 14 is a flowchart showing details of the data read process in the first modification of the first embodiment. When the overall controller 22 of the memory controller 200 determines that the data is read from the memory device 100 (i.e., YES in step S3), the overall controller 22 reads data from the memory device 100 (step S71). The overall controller 22 acquires temperature data of the specified memory device 100 (step S72). For example, the overall controller 22 controls the memory interface 24 to instruct the specified memory device 100 to transmit temperature data. When the transmission of the temperature data is instructed, the sequencer 12 acquires current temperature information MND from the temperature sensor 17 and transmits, to the memory controller 200, data indicating the temperature (i.e, temperature data) included in the acquired temperature information MND. When the overall controller 22 of the memory controller 200 receives the temperature data, the overall controller 22 stores the current temperature of the specified memory device 100 indicated by the temperature data in the memory device temperature information 231 for the memory device 100 on the RAM 23.

The overall controller 22 determines whether the current temperature of the specified memory device 100 is within a predetermined temperature range with respect to the temperature of the corresponding page in the write temperature table (step S73). For example, the overall controller 22 calculates the difference between the write temperature of the page address of the page, from which the data is read, stored in the write temperature table of the memory device temperature information 231 on the RAM 23 and the current temperature stored in the same memory device temperature information 231. The overall controller 22 determines whether the difference is within the temperature difference indicated by the above-described predetermined temperature. For example, when the write temperature is 0° C., the current temperature is 60° C., and the predetermined temperature is 65° C., the overall controller 22 determines that the current temperature is within the predetermined temperature range with respect to the temperature of the corresponding page in the write temperature table. When the overall controller 22 determines that it is within the predetermined temperature range (i.e., YES in step S73), the overall controller 22 ends the data read process (i.e, END in FIG. 14).

On the other hand, when the overall controller 22 determines that the current temperature of the specified memory device 100 is out of the predetermined temperature range with respect to the temperature of the corresponding page in the write temperature table (i.e., NO in step S73), the overall controller 22 controls the memory interface 24 to instruct the specified memory device 100 to shift write data. In response to this, the sequencer 12 controls the potential generator 13, the driver 14, the row decoder 15, and the sense amplifier 16 to shift write the read data to the selected cell unit CU and write the acquired temperature data as the write temperature information (step S74). Thus, when the shift write of one page size is ended, the sequencer 12 updates the write temperature information written in the high reliability area HRA (step S75). That is, the sequencer 12 writes the write temperature information recorded in the redundant area RA into the high reliability area HRA together with the page address information. In addition, the sequencer 12 transmits the write temperature information and the page address information written in the high reliability area HRA to the memory controller 200. In memory controller 200, based on the transmitted information, the overall controller 22 updates the contents of the write temperature table included in the memory device temperature information 231 on the RAM 23 (step S76). Then, the data read process is ended (i.e., END in FIG. 14).

In the first embodiment, the example in which data is written regardless of the temperature of the memory device 100 when data is written has been described. In a second modification of the first embodiment, alternatively, the shift write may be performed according to the current temperature of the memory device 100 instead.

FIG. 15 is a flowchart illustrating details of the data write process in the second modification of the first embodiment. Between step S63 and step S64, the sequencer 12 determines whether the current temperature is within a predetermined temperature range, based on the temperature information MND stored in the register 121 (step S67). The predetermined temperature range is, for example, 50° C. or less, and is a value range for determining whether the current temperature is low or high. When the sequencer 12 determines that the current temperature is within the predetermined temperature range, that is, when the temperature is low (i.e., YES in step S67), the sequencer 12 performs step S64. On the other hand, when the sequencer 12 determines that the current temperature is not within the predetermined temperature range, that is, when the temperature is high (i.e., NO in step S67), the sequencer 12 shift writes data with the write temperature information (step S68). After step S68, the sequencer 12 performs step S65.

The temperature is not uniform for each memory device 100 and further for each block of one memory device 100, depending on the usage status of the memory system 1. Therefore, the memory device or block to be written may be changed, depending on the current temperature.

Second Embodiment

The first embodiment has described the example of recording the write temperature information for each page. A second embodiment is a case where write temperature information is recorded for each block.

Hereinafter, portions different from the first embodiment will be described.

<2.1. Configuration>

The memory system 1 in the second embodiment, the memory controller 200, and the memory device 100 of the second embodiment have the same components and connections as those of the first embodiment. On the other hand, in the second embodiment, the memory controller 200 and the memory device 100 are configured to perform the operations described below.

<2.2. Operation>

The memory controller 200 stores a write temperature table illustrated in FIG. 16 for each memory device 100 while the memory system 1 is turned on. The write temperature table in the second embodiment indicates the correspondence between the address of the block BLK and the lowest temperature and the highest temperature among the write temperatures of each page acquired from the temperature information measured by the temperature sensor 17 at the time of writing to the cell unit CU of the block.

FIG. 17 is a flowchart illustrating details of the data write process in the memory system of the second embodiment. The overall controller 22 selects the write-target memory device 100 as in step S61 described in the first embodiment (step S601). The overall controller 22 transmits a control signal for writing data to the selected memory device 100 as in step S62 described in the first embodiment (step S602).

When the memory device 100 receives the write control signal, the sequencer 12 acquires the temperature information MND as in the step S63 described in the first embodiment. Also, the sequencer 12 transmits, to the memory controller 200, data indicating the temperature (i.e., temperature data) included in the temperature information MND. The overall controller 22 of the memory controller 200 receives temperature data from the sequencer 12 of the selected memory device 100, and stores the temperature data in the memory device temperature information 231 (Step S603).

Next, the sequencer 12 controls the potential generator 13, the driver 14, the row decoder 15, and the sense amplifier 16 to write the write data into the selected cell unit CU (step S604). Here, the data of the frame which is the substantial data in the write data is written to the data area DA, and the error correction data is written to the redundant area RA. Unlike the first embodiment, the write temperature information is not written to the redundant area RA. The operation of step S603 and the operation of step S604 may be performed in reverse order.

The overall controller 22 determines whether the current temperature of the selected memory device 100 is within the write temperature range of the block BLK including the corresponding page of the write temperature table (step S605). For example, the overall controller 22 determines whether the current temperature is between the minimum temperature and the maximum temperature of the write temperature, which are recorded in the write temperature table of the memory device temperature information 231 of the RAM 23. When the overall controller 22 determines that the current temperature is within the write temperature range, the overall controller 22 ends the data write process (i.e, END in FIG. 17).

On the other hand, when the overall controller 22 determines that the current temperature is out of the write temperature range, the overall controller 22 controls the memory interface 24 to instruct the selected memory device 100 to record the write temperature information. In response to this instruction, the sequencer 12 writes the temperature data included in the temperature information MND stored in the register 121 into the high reliability area HRA as the write temperature information together with the block address information (step S606).

The overall controller 22 updates the contents of the write temperature table included in the memory device temperature information 231 for the selected memory device 100 based on the current temperature (step S607). Then, the data write process is ended (i.e., END in FIG. 17). The operation of step S606 and the operation of step S607 may be performed in reverse order.

The data read process, the data erasure process, and the NAND temperature acquisition process are the same as in the first embodiment. However, one determined as the verify write target in steps S96 and S97 of the NAND temperature acquisition process is not the page but the block BLK. Plural blocks BLK may be determined as the target. Therefore, the verify write instruction transmitted to the verify write target memory device 100 in step S98 includes a signal specifying the block BLK, verify write command, and an address signal.

Figure 18:
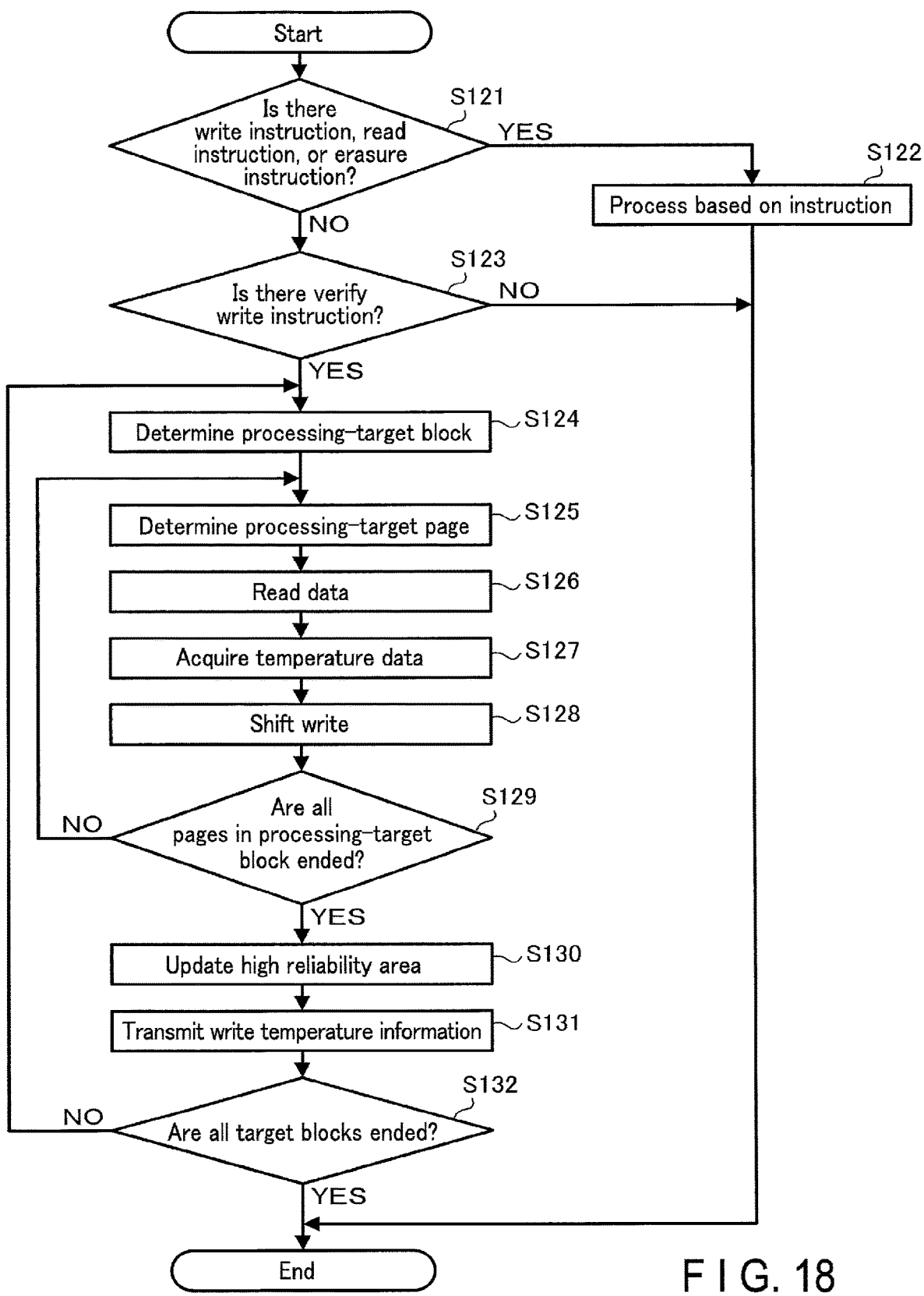
FIG. 18 is a flowchart illustrating an example of an operation of a memory device of the second embodiment.

FIG. 18 is a flowchart illustrating an example of the operation of the memory device of the second embodiment. As illustrated in FIG. 18, the sequencer 12 of the memory device 100 determines whether there is a write instruction, a read instruction, or an erasure instruction, as in step S101 described in the first embodiment (step S121). When the overall controller 22 determines that there is the write instruction, the read instruction, or the erasure instruction (i.e., YES in step S121), the memory device 100 performs a process based on the write instruction, the read instruction, or the erasure instruction, that is, the write, the read, or the erasure (step S122). After step S122, the sequencer 12 ends the process (i.e, END in FIG. 18).

When the overall controller 22 determines that there is no write instruction, read instruction, or erasure instruction (i.e., NO in step S121), i.e., in the idle time of the memory device 100, the sequencer 12 determines the presence or absence of the verify write instruction from the memory controller 200 as in step S103 described in the first embodiment (step S123). When the overall controller 22 determines that there is no verify write instruction (i.e., NO in step S123), the sequencer 12 of the memory device 100 ends the process (i.e, END in FIG. 18).

When the overall controller 22 determines that there is the verify write instruction (i.e., YES in step S123), the sequencer 12 determines the processing-target block BLKx, based on the verify write instruction (step S124). The sequencer 12 determines the processing-target page of the cell unit CUy in the determined block BLKx (step S125). As in step S105 and step S106 described in the first embodiment, the sequencer 12 reads the data written in the processing-target page (step S126), acquires temperature information MND including data indicating temperature (i.e., temperature data) from the temperature sensor 17, and stores the same in the register 121 (step S127). The sequencer 12 controls the potential generator 13, the driver 14, the row decoder 15, and the sense amplifier 16 to shift write the read data to the selected cell unit CUy (step S128). Unlike the first embodiment, the verify write according to the present embodiment does not write the acquired temperature data.

Thus, when the shift write of one page size is ended, the sequencer 12 determines whether the shift write is ended for all the pages in the processing-target block BLKx (step S129). When the overall controller 22 determines that the shift write has not been ended for all pages in the processing-target block BLKx (i.e., NO in step S129), the sequencer 12 then performs step S125 to execute a process for the next page.

When it is determined that the shift write has been ended for all pages in the processing-target block BLKx (i.e., YES in step S129), the sequencer 12 writes the highest temperature and the lowest temperature of the temperature information of each page stored in the register 121 as the write temperature information together with the block address information into the high reliability area HRA (step S130). The sequencer 12 transmits the write temperature information and the block address information written in the high reliability area HRA to the memory controller 200 (step S131).

The sequencer 12 determines whether the process for all the blocks BLK included in the verify write instruction is ended (step S132). When the overall controller 22 determines that the process for all the blocks BLK included in the verify write instruction is not ended (i.e., NO in step S132), the sequencer 12 then performs step S124. When the overall controller 22 determines that the process for all the blocks BLK included in the verify write instruction is ended (i.e., YES in step S132), the sequencer 12 ends the process (i.e, END in FIG. 18).

<2.3. Advantages>

According to the second embodiment, the memory controller 200 can acquire the same effect as that of the first embodiment. In addition, according to the second embodiment, the memory device 100 does not record write temperature information in the redundant area RA. Therefore, the area available for the substantial data or the error correction data is larger than that of the first embodiment, and the storage capacity of the substantial data of the memory device 100 can be increased, or more powerful error correction can be performed.

According to the second embodiment, the memory device 100 records the write temperature information not in page units but in block units in the high reliability area HRA. Therefore, the write temperature information to be stored can be reduced, and the high reliability area HRA can be used for another purpose. The storage capacity of the memory device 100 can be further increased by using even the unused high reliability area HRA for storing the substantial data.

<2.4. Modifications>

In many cases, the memory system 1 writes data continuously to plural cell units CU, and typically writes data continuously to cell units CU in one block BLK. Such write is ended in a short period by the selected memory device 100, and thus, during the write to the cell units CU in one block BLK, the temperature at the temperature sensor 17 is substantially constant. Therefore, as the write temperature information of the block BLK, one temperature may be set for the block BLK as in the first embodiment. That is, the write temperature for a certain block BLK may be considered to be the same as the write temperature for any of the cell units CU in the block BLK.

Although the example in which the write temperature is managed for each block BLK has been described, the write temperature can be managed in any unit. For example, the write temperature may be managed for each of the blocks BLK.

In the second embodiment as well, the shift write may be performed at the time of the data read or the data write as described in the modification of the first embodiment. In the second embodiment as well, as described in the modification of the first embodiment, the write-target memory device or block may be changed according to the current temperature.

<3. Others>

In the first and second embodiments, the case where the memory device 100 is the NAND flash memory has been described as an example. The memory device 100 may be another memory device such as MRAM (ferromagnetic memory), PCRAM (phase change memory), FeRAM (ferroelectric memory), or the like. For example, in the case of the MRAM, the rewrite is performed to shift the direction of magnetization. In other memory devices as well, the rewrite may be performed based on the temperature dependency specific to the memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A memory system comprising:
   a memory device including a plurality of first storage elements configured to store data;
   a temperature sensor configured to measure a temperature of the memory device; and
   a controller, wherein
   the controller includes a processor configured to:
      acquire a current temperature from the temperature sensor as a first temperature;

acquire a temperature when the data is written into the first storage element, from the memory device as a second temperature;
determine whether a difference between the first temperature and the second temperature exceeds a predetermined temperature difference; and
when the difference exceeds the predetermined temperature difference, instruct the memory device to rewrite the data written in the first storage element, and
the memory device includes a sequencer configured to determine a voltage for the rewrite, based on the difference and a voltage when the data is written into the first storage element, and
when the rewrite of the data is performed, the second temperature is updated and an updated second temperature is rewritten into a second storage element.

2. The memory system according to claim 1, wherein the processor is configured to check, at regular intervals, whether the difference exceeds the predetermined temperature difference.

3. The memory system according to claim 1, wherein the sequencer is configured to, when an instruction to rewrite the data is received from the controller, rewrite the data in an idle time of the memory device.

4. The memory system according to claim 1, wherein the second storage element is included in the memory device and configured to, when a write of the data is performed, be written the temperature acquired from the temperature sensor as the second temperature.

5. The memory system according to claim 4, wherein the controller includes a buffer configured to store the second temperature acquired upon boot,
the sequencer is configured to transmit the second temperature rewritten in the second storage element when the rewrite of the data is performed, to the controller, and
the processor is configured to update storage contents of the buffer, in response to the transmission of the second temperature from the memory device.

6. The memory system according to claim 1, wherein the memory device includes a block including a plurality of pages each including a plurality of the first storage elements,
the memory device is configured to perform a write of substantial data to be stored in the page unit,
the page includes:
a data area for writing the substantial data; and
a redundant area for writing associated data associated with the substantial data,
the second temperature is a temperature associated with the temperature of the memory device at a time of writing data in the page unit, which is acquired by the temperature sensor, and
the sequencer is configured to write the second temperature into the first storage element of the redundant area.

7. The memory system according to claim 6, wherein the memory device further includes a high reliability area including a second storage element that reliability of data read with respect to a temperature change is higher than the first storage element of the data area, and
the sequencer is configured to write the second temperature written in the first storage element of the redundant area of the page into the high reliability area together with address information of the page.

8. The memory system according to claim 7, wherein the sequencer is configured to, when the rewrite of the data is performed, update the second temperature and rewrite an updated second temperature into the high reliability area.

9. The memory system according to claim 8, wherein the controller includes a buffer configured to store the second temperature acquired upon boot,
the sequencer is configured to transmit the second temperature rewritten in the high reliability area when the rewrite of the data is performed, to the controller, and
the processor is configured to update storage contents of the buffer, in response to the transmission of the second temperature from the memory device.

10. The memory system according to claim 9, wherein the memory device is configured to erase the substantial data in the block unit,
the processor is configured to instruct the memory device to erase the substantial data in an erasure-target block, and
the sequencer is configured to, when the erase of the substantial data is performed, erase the second temperature written in the high reliability area corresponding to the block from which the substantial data has been erased.

11. The memory system according to claim 10, wherein the processor is configured to update the storage contents of the buffer corresponding to the block of the memory device instructed to erase.

12. The memory system according to claim 1, wherein the memory device includes:
a block including pages each including the first storage elements for writing substantial data to be stored; and
a high reliability area including a second storage element that reliability of data read with respect to a temperature change is higher than the first storage element for writing the substantial data,
the memory device is configured to perform a write of the substantial data in the page unit,
the second temperature is a block-unit temperature associated with a minimum temperature and a maximum temperature of temperatures of the memory device at times of writing data to each page in the block acquired by the temperature sensor, and
the sequencer is configured to write the second temperature into the high reliability area.

13. The memory system according to claim 12, wherein the sequencer is configured to
when writing data in the page unit, check whether either the minimum temperature or the maximum temperature at the acquired second temperature is out of a temperature range indicated by the second temperature already written in the high reliability area with respect to the block including the page to which the data has been written; and
when either the minimum temperature or the maximum temperature at the second temperature is out of the temperature range, update the second temperature acquired out of the range and record an updated second temperature into the high reliability area.

14. The memory system according to claim 13, wherein the sequencer is configured to, when the rewrite of the data is performed, update the second temperature and rewrite an updated second temperature into the high reliability area.

15. The memory system according to claim 14, wherein:
the controller includes a buffer configured to store the second temperature acquired upon boot,
the sequencer is configured to transmit the second temperature rewritten in the high reliability area when the rewrite of the data is performed, to the controller, and
the processor is configured to update storage contents of the buffer in response to the transmission of the second temperature from the memory device.

16. The memory system according to claim 15, wherein the memory device is configured to erase the substantial data in the block unit,
the processor is configured to instruct the memory device to erase the substantial data in an erasure-target block, and
the sequencer is configured to, when the erase of the substantial data is performed, erase the second temperature written in the high reliability area corresponding to the block from which the substantial data has been erased.

17. The memory system according to claim 16, wherein the processor is configured to update the storage contents of the buffer corresponding to the block of the memory device instructed to erase.

\* \* \* \* \*